US012046556B2

(12) United States Patent
Lee et al.

(10) Patent No.: US 12,046,556 B2
(45) Date of Patent: Jul. 23, 2024

(54) SEMICONDUCTOR DEVICES HAVING HIGHLY INTEGRATED ACTIVE AND POWER DISTRIBUTION REGIONS THEREIN

(71) Applicant: Samsung Electronics Co., Ltd., Suwon-si (KR)

(72) Inventors: Eui Bok Lee, Seoul (KR); Wan Don Kim, Seongnam-si (KR); Hyun Bae Lee, Seoul (KR); Yoon Tae Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 465 days.

(21) Appl. No.: 17/475,141

(22) Filed: Sep. 14, 2021

(65) Prior Publication Data
US 2022/0208679 A1   Jun. 30, 2022

(30) Foreign Application Priority Data

Dec. 31, 2020  (KR) .......................... 10-2020-0188864

(51) Int. Cl.
*H01L 23/528* (2006.01)
*H01L 23/48* (2006.01)
*H01L 29/06* (2006.01)
*H01L 29/423* (2006.01)
*H01L 29/786* (2006.01)

(52) U.S. Cl.
CPC ........ *H01L 23/5286* (2013.01); *H01L 23/481* (2013.01); *H01L 29/0665* (2013.01); *H01L 29/42392* (2013.01); *H01L 29/78696* (2013.01)

(58) Field of Classification Search
CPC . B82Y 10/00; H01L 27/088; H01L 21/76895; H01L 21/76898; H01L 21/823475; H01L 21/823481; H01L 23/481; H01L 23/485; H01L 23/5286; H01L 23/535; H01L 29/0665; H01L 29/09673; H01L 29/1079; H01L 29/4175; H01L 29/42392; H01L 29/66439; H01L 29/775; H01L 29/785; H01L 29/78696
USPC ....................................................... 257/401
See application file for complete search history.

(56) References Cited

U.S. PATENT DOCUMENTS

| | | | |
|---|---|---|---|
| 10,522,459 B2 | 12/2019 | Ohtou et al. |
| 10,586,765 B2 | 3/2020 | Smith et al. |
| 10,636,739 B2 | 4/2020 | Beyne et al. |
| 10,685,865 B2 | 6/2020 | Sung et al. |

(Continued)

FOREIGN PATENT DOCUMENTS

| KR | 20170057820 A | 5/2017 |
|---|---|---|
| KR | 20200049468 A | 5/2020 |

*Primary Examiner* — Fazli Erdem
(74) *Attorney, Agent, or Firm* — Myers Bigel, P.A.

(57) ABSTRACT

A FINFET includes a substrate having a semiconductor fin extending upward from a first surface thereof, and first and second power rails on first and second opposing sides of the semiconductor fin, respectively. A base of the semiconductor fin may be recessed within a trench within the surface of the substrate, and the first and second power rails may at least partially fill the trench. A through-substrate via may be provided, which extends from adjacent a second surface of the substrate to at least one of the first and second power rails. A source/drain contact is also provided, which is electrically connected to a source/drain region of the FINFET and at least one of the first and second power rails.

20 Claims, 27 Drawing Sheets

(56) References Cited

U.S. PATENT DOCUMENTS

| | | | |
|---|---|---|---|
| 10,734,224 B2 | 8/2020 | Smith et al. | |
| 2018/0374791 A1* | 12/2018 | Smith | H01L 21/76224 |
| 2019/0288004 A1* | 9/2019 | Smith | H01L 21/76895 |
| 2020/0043945 A1 | 2/2020 | Kim et al. | |
| 2020/0135634 A1 | 4/2020 | Chiang et al. | |
| 2020/0152508 A1* | 5/2020 | Jourdain | H01L 21/3212 |
| 2020/0203210 A1 | 6/2020 | Yakimets et al. | |
| 2020/0203276 A1* | 6/2020 | Hiblot | H01L 21/743 |
| 2020/0303551 A1* | 9/2020 | Chen | H01L 23/481 |
| 2022/0102535 A1* | 3/2022 | Wang | H01L 29/41733 |

* cited by examiner

SEMICONDUCTOR DEVICES HAVING HIGHLY INTEGRATED ACTIVE AND POWER DISTRIBUTION REGIONS THEREIN

REFERENCE TO PRIORITY APPLICATION

This application claims priority under 35 U.S.C. § 119 to Korean Patent Application No. 10-2020-0188864, filed Dec. 31, 2020, the disclosure of which is hereby incorporated herein by reference.

BACKGROUND

1. Field of the Disclosure

The present disclosure relates to integrated circuit devices and, more particularly, to highly integrated semiconductor devices.

2. Description of the Related Art

When forming a device including a plurality of semiconductor elements such as an integrated circuit, a standard cell may be used as a basic unit cell for fabricating and designing an integrated circuit. The standard cell may be used to form one or more functional circuits. Each standard cell may have the same footprint (e.g., each standard cell may have a standard footprint). When designing complex circuits and components, the use of standard cells may reduce design and fabricating costs.

When using such standard cells, each standard cell included in the device may require a power input Vdd and/or a ground Vss connection. To apply power to the various components of the device, each standard cell may generally be coupled to a power rail. The power rail may be electrically connected to an active layer of the standard cell to provide the power Vdd. In some cases, a plurality of power rails may be provided to supply the power Vdd and the ground Vss to the standard cells.

Furthermore, a chip level power grid may be included inside the device to provide power to each power rail. The chip level power grid may be executed between various standard cells or through various standard cells. And, the chip level power grid may be electrically connected to the power rail at various points along a length direction of the power rail.

SUMMARY

Aspects of the present disclosure provide a semiconductor device having a buried power rail capable of reducing an IR drop (i.e., voltage drop) along its length.

According to some aspects of the present inventive concept, there is provided a semiconductor device comprising a substrate, which includes a first surface and a second surface opposite to the first surface in a first direction. A fin type pattern is provided, which protrudes upward from the first surface of the substrate and extends in a second direction perpendicular to the first direction. A pair of power rails are provided, which are placed on both sides of the fin type pattern and extend in the second direction. A source/drain contact may also be provided, which is placed on the first surface of the substrate. This source/drain contact may be directly electrically connected to the pair of power rails.

According to some aspects of the present inventive concept, there is provided a semiconductor device including a pair of power rails which extend lengthwise in a first direction and are spaced apart in a second direction different from the first direction, on a substrate. A fin type pattern is provided, which is placed between the pair of power rails and extends in the first direction. A source/drain pattern is provided, which is placed on the fin type pattern. A source/drain contact is provided, which extends in the second direction on the fin type pattern, and connects the source/drain pattern and the pair of power rails together.

According to some additional aspects of the present inventive concept, there is provided a semiconductor device, which includes a substrate including a first surface and a second surface opposite to the first surface in a first direction. A rail trench is provided, which is retracted from the first surface of the substrate toward the second surface of the substrate. A fin type pattern is provided, which protrudes from a bottom surface of the rail trench. The fin type pattern includes an upper surface protruding upward from the first surface of the substrate. A pair of power rails are provided, which extend on both sides of the fin type pattern and extend in a second direction perpendicular to the first direction. A source/drain contact is provided, which is placed on the first surface of the substrate and connects the pair of power rails. A through-via, which extends from the second surface of the substrate, is connected to the pair of power rails. A part of each of the power rails may be placed inside the rail trench.

According to further aspects of the present inventive concept, a FINFET is provided, which includes a substrate having a semiconductor fin extending upward from a first surface thereof, and first and second power rails on first and second opposing sides of the semiconductor fin, respectively. A base of the semiconductor fin may be recessed within a trench within the surface of the substrate, and the first and second power rails may at least partially fill the trench. A through-substrate via may be provided, which extends from adjacent a second surface of the substrate to at least one of the first and second power rails. A source/drain contact is also provided, which is electrically connected to a source/drain region of the FINFET and at least one of the first and second power rails.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

DETAILED DESCRIPTION OF THE EMBODIMENTS

Although drawings of a semiconductor device according to some embodiments show a fin type transistor (FinFET) including a channel region of a fin type pattern shape, a transistor including a nanowire or a nanosheet, and a MBCFET™ (Multi-Bridge Channel Field Effect Transistor), the embodiments are not limited thereto. For example, the semiconductor device according to some additional embodiments may include a tunneling transistor (tunneling FET) or a three-dimensional (3D) transistor. And, another semiconductor device according to some embodiments may include a planar transistor. In addition, the technical ideas of the present disclosure may be applied to a transistor (2D material based FETs) based on two-dimensional material, and a heterostructure thereof. Furthermore, a semiconductor device according to some other embodiments may include a bipolar junction transistor, a laterally diffused metal oxide semiconductor (LDMOS), or the like.

Figure 1:
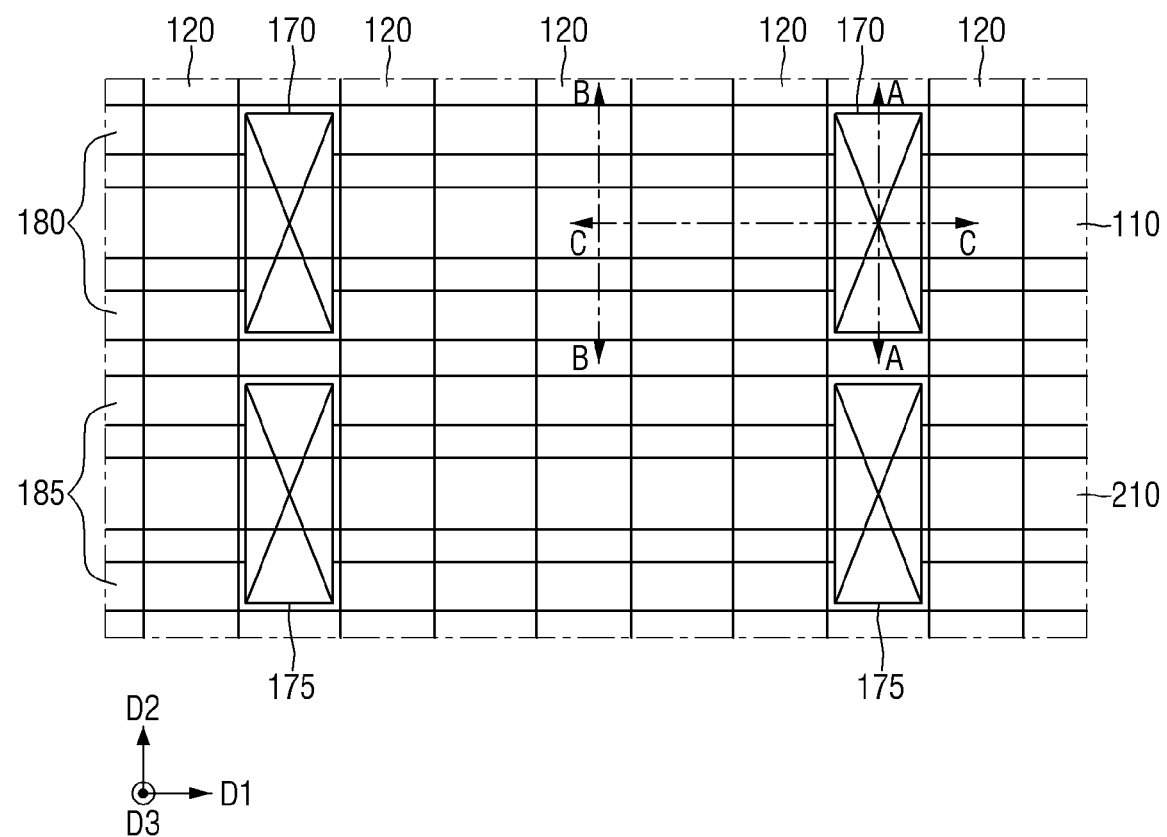
FIG. 1 is a plan layout diagram of a semiconductor device according to an embodiment of the invention.
Figure 2:
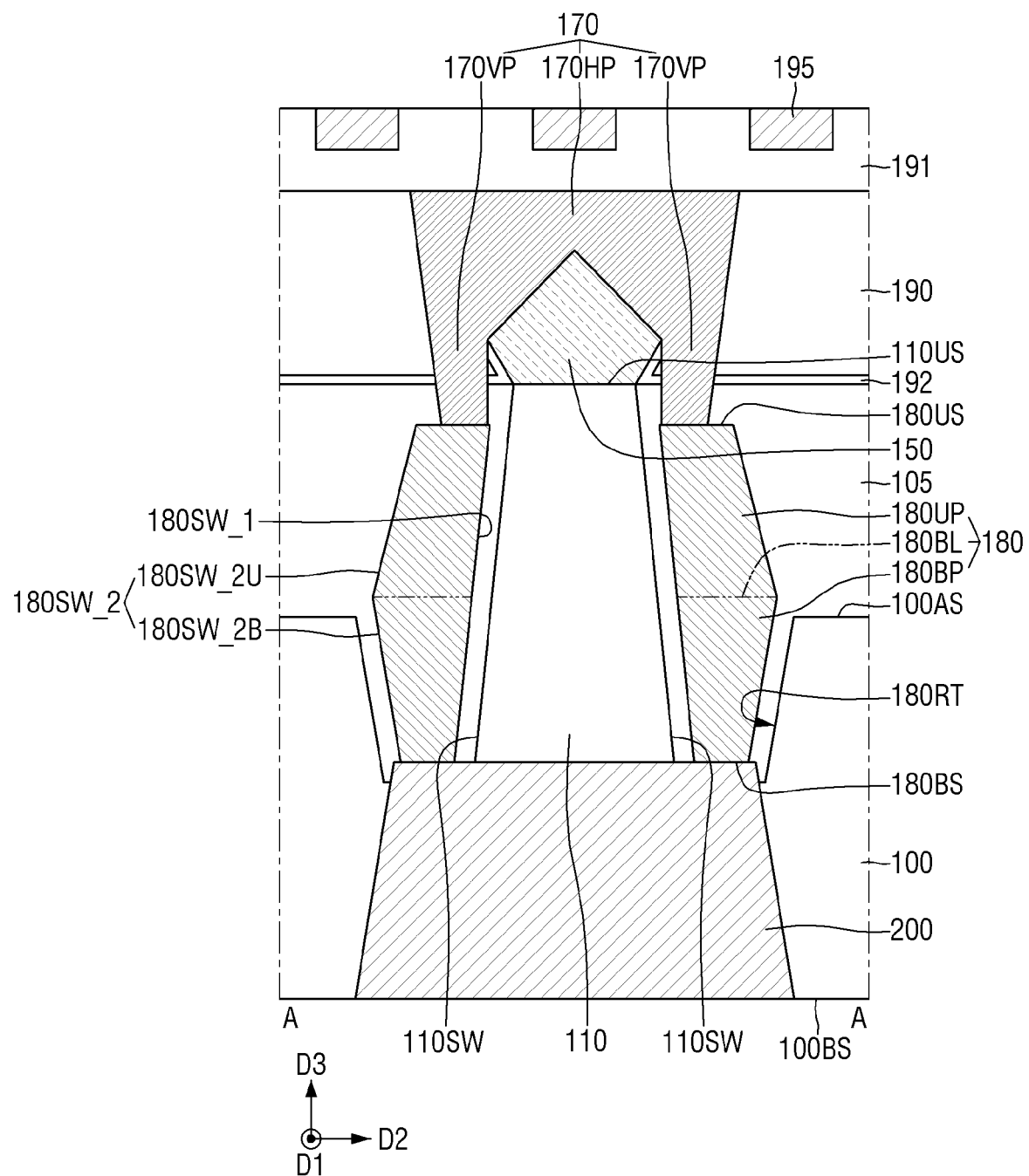
FIG. 2 is a cross-sectional view of the semiconductor device of FIG. 1, taken along line A-A of FIG. 1.
Figure 3:
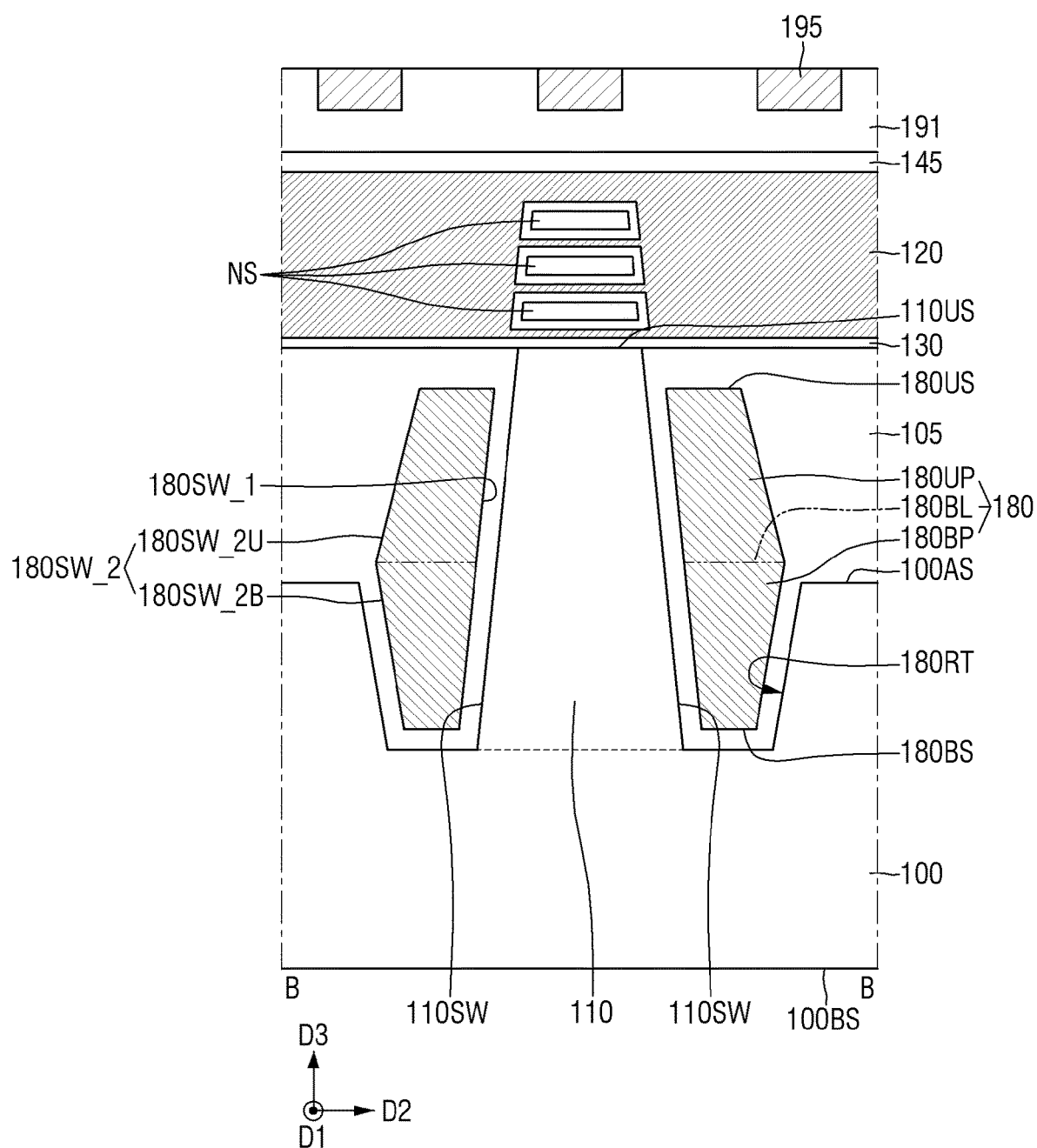
FIG. 3 is a cross-sectional view of the semiconductor device of FIG. 1, taken along line B-B of FIG. 1.
Figure 4:
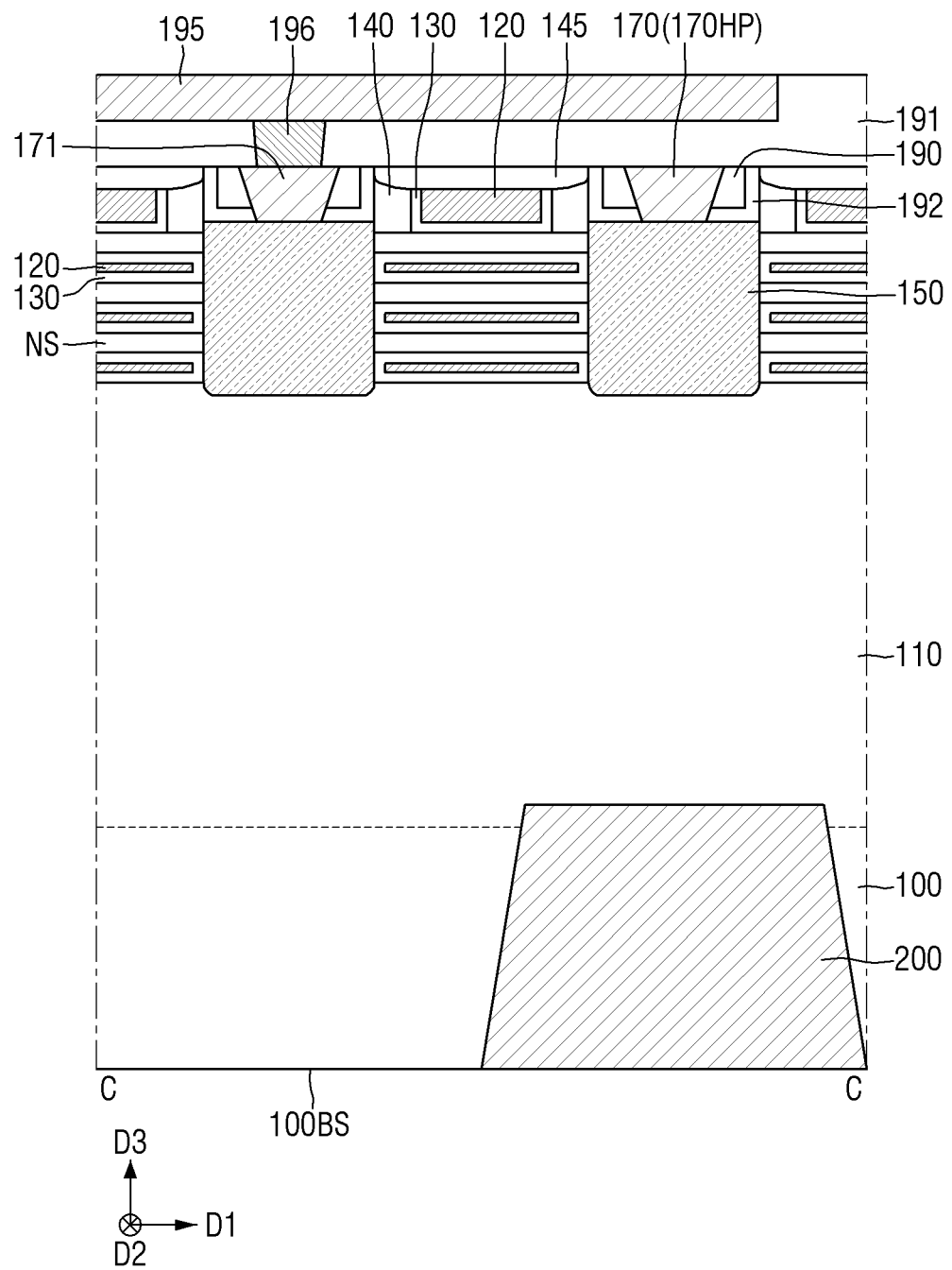
FIGS. 4-5 are alternative cross-sectionals views of the semiconductor device of FIG. 1, taken along line C-C of FIG. 1.
Figure 5:
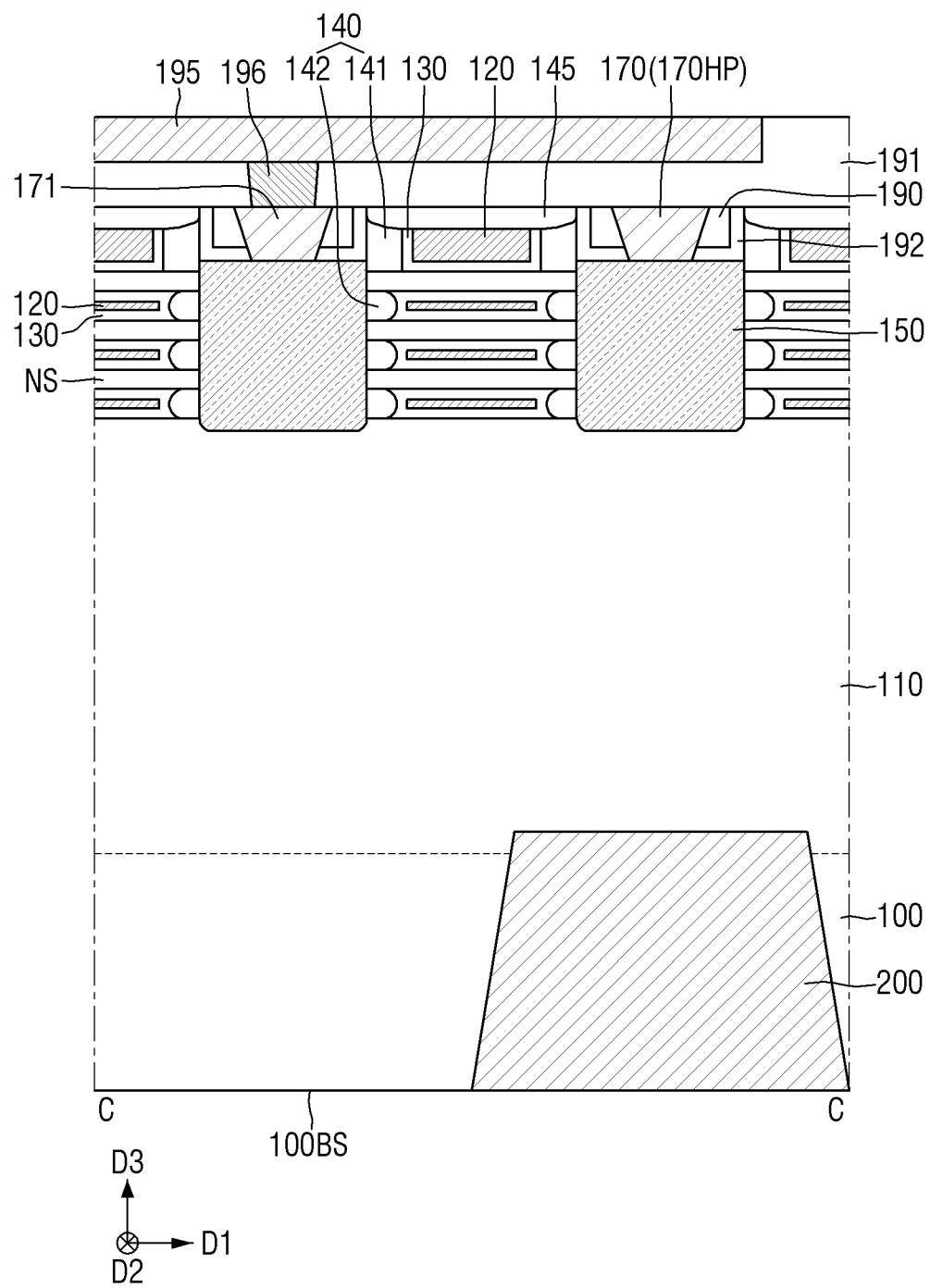

FIG. 1 is a layout diagram for explaining a semiconductor device according to some embodiments. FIG. 2 is an exemplary diagram taken along A-A of FIG. 1. FIG. 3 is an exemplary diagram taken along B-B of FIG. 1. FIGS. 4 and 5 are exemplary diagrams taken along C-C of FIG. 1. For convenience of explanation, FIG. 1 shows only first and second power supply source/drain contacts 170 and 175 connected to power rails 180 and 185.

Referring to FIGS. 1 to 5, the semiconductor devices according to some embodiments may include a first fin type pattern 110, a second fin type pattern 210, a sheet pattern NS, a gate electrode 120, a source/drain pattern 150, a first power rail 180, a second power rail 185, a first power supply source/drain contact 170, a second power supply source/drain contact 175, and a through via 200.

The substrate 100 may include a first surface 100AS and a second surface 100BS. The first surface 100AS of the substrate and the second surface 100BS of the substrate may be surfaces that are opposite to each other in a third direction D3. The substrate 100 may be bulk silicon or SOI (silicon-on-insulator) substrate. In contrast, the substrate 100 may be a silicon substrate or may include, but is not limited to, other materials such as silicon germanium, SGOI (silicon germanium on insulator), indium antimonide, lead tellurium compounds, indium arsenide, indium phosphide, gallium arsenide or gallium antimonide.

A rail trench 180RT may be formed inside the substrate 100. The rail trench 180RT may extend long in a first direction D1. The rail trench 180RT may be formed on the first surface 100AS of the substrate. The rail trench 180RT may be retracted from the first surface 100AS of the substrate toward the second surface 100BS of the substrate. A width of the rail trench 180RT in a second direction D2 decreases as it goes away from the first surface 100AS of the substrate.

The first fin type pattern 110 and the second fin type pattern 210 may each extend long along the first direction D1. The first fin type pattern 110 may be spaced apart from the second fin type pattern 210 in the second direction D2. The first direction D1 may be perpendicular to the second direction D2 and the third direction D3. The second direction D2 may be perpendicular to the third direction D3.

As an example, the first fin type pattern 110 may be placed in a region in which the PMOS is formed, and the second fin type pattern 210 may be placed in a region in which the NMOS is formed. As another example, the first fin type pattern 110 may be placed in the region in which the NMOS is formed and the second fin type pattern 210 may be placed in the region in which the PMOS is formed.

Since the description of the second fin type pattern 210 is substantially the same as that of the first fin type pattern 110, the following description will focus on the first fin type pattern 110. However, when there is a difference between the first fin type pattern 110 and the second fin type pattern 210, the difference will be briefly described.

The first fin type pattern 110 includes an upper surface 110US protruding upward from the first surface 100AS of the substrate. The upper surface 110US of the first fin type pattern protrudes from the first surface 100AS of the substrate in the third direction D3. The first fin type pattern 110 includes side walls 110SW that extend long in the first direction D1. The side walls 110SW of the first fin type pattern are opposite to each other in the second direction D2. The upper surface 110US of the first fin type pattern connects the opposite side walls 110SW of the first fin type pattern.

The width of the first fin type pattern 110 in the second direction D2 decreases as it goes away from the second surface 100BS of the substrate. That is, the distance between the opposite side walls 110SW of the first fin type pattern decreases as it approaches the upper surface 110US of the first fin type pattern.

In the semiconductor device according to some embodiments, the first fin type pattern 110 may protrude from a bottom surface of the rail trench 180RT. A part of the first fin type pattern 110 is placed inside the rail trench 180RT. The rest of the first fin type pattern 110 protrudes upward from the first surface 100AS of the substrate.

Each of the first fin type pattern 110 and the second fin type pattern 210 may be a part of the substrate 100, and may include an epitaxial layer that is grown from the substrate 100. Each of the first fin type pattern 110 and the second fin type pattern 210 may include, for example, silicon or germanium which is an elemental semiconductor material.

Further, each of the first fin type pattern 110 and the second fin type pattern 210 may include a compound semiconductor, and may include, for example, a group IV-IV compound semiconductor or a group III-V compound semiconductor. The group IV-IV compound semiconductor may be, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, one of a binary compound, a ternary compound or a quaternary compound formed by combining at least one of aluminum (Al), gallium (Ga) and indium (In) as a group III element with at least one of phosphorus (P), arsenic (As) and antimony (Sb) as a group V element.

As an example, the first fin type pattern 110 and the second fin type pattern 210 may include the same material. As another example, the first fin type pattern 110 may include a material different from the second fin type pattern 210. In the semiconductor device according to some embodiments, each of the first fin type pattern 110 and the second fin type pattern 210 may be a silicon fin type pattern.

A pair of first power rails 180 may be placed on either side of the first fin type pattern 110. The first fin type pattern 110 may be placed between the pair of first power rails 180. Each first power rail 180 may extend long in the first direction D1. Each first power rail 180 may be spaced apart from the first fin type pattern 110 in the second direction D2.

A pair of second power rails 185 may be placed on either side of the second fin type pattern 210. The second fin type pattern 210 may be placed between the pair of second power rails 185. Each second power rail 185 may extend long in the first direction D1. Each second power rail 185 may be spaced apart from the second fin type pattern 210 in the second direction D2.

As an example, the first power rail 180 may be used as a VDD power line, and the second power rail 185 may be used as a VSS power line. Alternatively, the first power rail 180 may be used as the VSS power line, and the second power rail 185 may be used as the VDD power line. For example, the VSS power line may be connected to a ground voltage. Since the description of the second power rail 185 is substantially the same as that of the first power rail 180, the following description will focus on the first power rail 180. However, when there is a difference between the first power rail 180 and the second power rail 185, the difference will be briefly explained.

A part of each first power rail 180 may be placed inside the rail trench 180RT. The first power rail 180 may include a portion placed in the rail trench 180RT, and a portion protruding upward from the first surface 100AS of the substrate. For example, the first power rail 180 may include a lower part 180BP and an upper part 180UP. The first power rail 180 may include a boundary line 180BL that divides the lower part 180BP of the first power rail and the upper part 180UP of the first power rail. The boundary line 180BL of the first power rail is defined between the lower part 180BP of the first power rail and the upper part 180UP of the first power rail. The lower part 180BP of the first power rail is directly connected to the upper part 180UP of the first power rail.

In the semiconductor device according to some embodiments, a part of the lower part 180BP of the first power rail is placed in the rail trench 180RT, and the rest thereof may protrude upward from the first surface 100AS of the substrate. The upper part 180UP of the first power rail protrudes upward from the first surface 100AS of the substrate. For example, the boundary line 180BL of the first power rail may be placed above the first surface 100AS of the substrate.

Each first power rail 180 may include a first side wall 180SW_1 and a second side wall 180SW_2. The first side wall 180SW_1 of the first power rail and the second side wall 180SW_2 of the first power rail extend in the first direction D1. The first power rail 180 may include an upper surface 180US and a bottom surface 180BS that connect the first side wall 180SW_1 of the first power rail and the second side wall 180SW_2 of the first power rail. The first side wall 180SW_1 of the first power rail may face the side wall 110SW of the first fin type pattern. The second side wall 180SW_2 of the first power rail may be a surface that is opposite to the first side wall 180SW_1 of the first power rail in the second direction D2.

A direction in which the first side wall 180SW_1 of the first power rail inclines may be the same as a direction in which the side wall 110SW of the first fin type pattern inclines. In other words, a sign of the inclination of the first side wall 180SW_1 of the first power rail may be the same as a sign of the inclination of the side wall 110SW of the first fin type pattern.

The direction in which the second side wall 180SW_2 of the first power rail inclines at the upper part 180UP of the first power rail may be the same as the direction in which the side wall 110SW of the first fin type pattern inclines. The sign of the inclination of the second side wall 180SW_2U at the upper part of the first power rail may be the same as the sign of the inclination of the side wall 110SW of the first fin type pattern.

On the other hand, the direction in which the second side wall 180SW_2 of the first power rail inclines at the lower part 180BP of the first power rail may be opposite to the direction in which the side wall 110SW of the first fin type pattern inclines. The sign of the inclination of the second side wall 180SW_2B at the lower part of the first power rail may be opposite to the sign of the inclination of the side wall 110SW of the first fin type pattern.

The direction in which the second side wall 180SW_2 of the first power rail inclines may change around the boundary line 180BL of the first power rail. The sign of the inclination of the second side wall 180SW_2 of the first power rail at the upper part 180UP of the first power rail may be the opposite of the sign of the inclination of the second side wall 180SW_2 of the first power rail at the lower part 180BP of the first power rail. As an example, when the sign of the inclination of the second side wall 180SW_2U at the upper part of the first power rail is assumed to be a positive number, the sign of the inclination of the second side wall 180SW_2B at the lower part of the first power rail may be a negative number. As another example, when the sign of the inclination of the second side wall 180SW_2U at the upper part of the first power rail is assumed to be a negative number, the sign of the inclination of the second side wall 180SW_2B at the lower part the first power rail may be a positive number.

In the semiconductor device according to some embodiments, the width of the lower part 180BP of the first power rail in the second direction D2 increases as it goes away from the second surface 100BS of the substrate. In other words, the width of the lower part 180BP of the first power rail increases as it goes away from the bottom surface of the rail trench 180RT.

Each of the first power rail 180 and the second power rail 185 may include, for example, at least one of ruthenium (Ru), rhodium (Rh), iridium (Ir), molybdenum (Mo), tungsten (W), cobalt (Co) RuAl, NiAl, NbB$_2$, MoB$_2$, TaB$_2$, V$_2$AlC, and CrAlC.

The field insulating film 105 may be formed on the substrate 100. The field insulating film 105 may be placed on the first surface 100AS of the substrate. A part of the field insulating film 105 may be placed in the rail trench 180RT. The field insulating film 105, which provides electrical isolation, is placed between the first fin type pattern 110 and the first power rail 180. The first fin type pattern 110 may be electrically separated from the first power rail 180 by the field insulating film 105. The field insulating film 105 may cover at least a part of the side wall 110SW of the first fin type pattern. The field insulating film 105 does not cover the upper surface 110US of the first fin type pattern.

The field insulating film 105 may cover the upper surface 180US of the first power rail. The field insulating film 105 may cover the first side wall 180SW_1 of the first power rail and the second side wall 180SW_2 of the first power rail. In the portion in which a through via 200 to be described later is not formed, the field insulating film 105 may cover the bottom surface 180BS of the first power rail.

The field insulating film 105 placed between the side wall 110SW of the first fin type pattern and the first side wall 180SW_1 of the first power rail may be formed in a fabricating process different from that of the field insulating film 105 that covers the second side wall 180SW_2 of the first power rail and the upper surface 180US of the first power rail. The field insulating film 105 may include, for example, an oxide film, a nitride film, an acid nitride film, or a combination film thereof.

The plurality of sheet patterns NS may be placed on the upper surface 110US of the first fin type pattern. The plurality of sheet patterns NS may be spaced part from the first fin type pattern 110 in the third direction D3. Each sheet pattern NS may include a plurality of nanosheets sequentially placed in the third direction D3. Each sheet pattern NS is placed to be higher than the upper surface of the field insulating film 105.

Although three sheet patterns NS are shown as being placed in the third direction D3, this is for convenience of explanation, and the number thereof is not limited thereto. Although not shown, the sheet pattern may also be placed on the second fin type pattern 210. The sheet pattern NS may be used as a channel region of the transistor.

The sheet pattern NS may include one of silicon or germanium, which is an elemental semiconductor material, a group IV-IV compound semiconductor, or a group III-V compound semiconductor. Each sheet pattern NS may include the same material as the first fin type pattern 110, or may include a material different from the first fin type pattern 110. In the semiconductor device according to some embodiments, the sheet pattern NS may be a silicon sheet pattern including silicon.

A width of the sheet pattern NS in the second direction D2 may be increased or decreased in proportion to a width of the first fin type pattern 110 in the second direction D2. As an example, although the drawing shows that the width in the second direction D2 of the sheet patterns NS stacked in the third direction D3 decreases as it goes away from the first fin type pattern 110, the embodiment is not limited thereto. Unlike that shown, the width in the second direction D2 of the sheet patterns NS stacked in the third direction D3 may be the same.

The plurality of gate electrodes 120 may be placed on the substrate 100. The plurality of gate electrodes 120 may be placed on the first surface 100AS of the substrate. Each gate electrode 120 may extend in the second direction D2. Adjacent gate electrodes 120 may be spaced apart from each other in the first direction D1.

The gate electrode 120 may be formed on the first fin type pattern 110 and the second fin type pattern 210. The gate electrode 120 may intersect the first fin type pattern 110 and the second fin type pattern 210. The gate electrode 120 may surround the sheet pattern NS.

Although the gate electrode 120 is shown to intersect the first fin type pattern 110 and the second fin type pattern 210, the embodiment is not limited thereto. Unlike that shown, the gate electrode 120 may include a first gate electrode and a second gate electrode that are spaced apart from each other in the second direction D2 and arranged in the second direction D2. The first gate electrode intersects the first fin type pattern 110, but may not intersect the second fin type pattern 210. The second gate electrode intersects the second fin type pattern 210, but may not intersect the first fin type pattern 110.

The plurality of first gate structures GS1 may be placed between a first gate separation structure 160 which extends long in the first direction D1. Each first gate structure GS1 may extend in the second direction D2, and adjacent first gate structures GS1 may be spaced apart from each other in the first direction D1.

The gate electrode 120 may include at least one of a metal, a metal alloy, a conductive metal nitride, a metal silicide, a doped semiconductor material, a conductive metal oxide and a conductive metal oxynitride. The gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxide and the conductive metal oxynitride may include, but are not limited to, oxidized forms of the aforementioned materials.

The gate electrode 120 may be placed on both sides of a source/drain pattern 150 to be described below. The gate electrode 120 may be placed on either side of the source/drain pattern 150 in the first direction D1. As an example, both the gate electrodes 120 placed on either side of the source/drain pattern 150 may be a normal gate electrode used as a gate of the transistor. As another example, although the gate electrode 120 placed on one side of the source/drain pattern 150 is used as a gate of the transistor, the gate electrode 120 placed on the other side of the source/drain pattern 150 may be a dummy gate electrode in some alternative embodiments.

The gate insulating film 130 may extend along the upper surface of the field insulating film 105 and the upper surface 110US of the first fin type pattern. The gate insulating film 130 may surround the sheet pattern NS. The gate insulating film 130 may be placed along the periphery of the sheet pattern NS. The gate electrode 120 is placed on the gate insulating film 130. The gate insulating film 130 is placed between the gate electrode 120 and the sheet pattern NS1. In particular, a part of the gate insulating film 130 and a part of the gate electrode 120 may be placed between the sheet patterns NS adjacent to each other in the third direction D3, and between the first fin type pattern 110 and the sheet pattern NS1. The gate insulating film 130 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although the gate insulating film 130 is shown as a single film, this is only for convenience of explanation, and the embodiment is not limited thereto. The gate insulating film 130 may include a plurality of films. The gate insulating film 130 may also include an interfacial layer placed between the sheet pattern NS and the gate electrode 120, and a high dielectric constant insulating film.

The semiconductor device according to some embodiments may include an NC (Negative Capacitance) FET that uses a negative capacitor. For example, the first gate insulating film 130 may include a ferroelectric material film having ferroelectric properties, and a paraelectric material film having paraelectric properties. In some embodiments, the ferroelectric material film may have a negative capacitance, and the paraelectric material film may have a positive capacitance. For example, if two or more capacitors are connected in series and the capacitance of each capacitor has a positive value, the overall capacitance decreases from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase. Taking advantage of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr) and oxygen (O). The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may change, depending on which type of ferroelectric material is included in the ferroelectric material film.

Moreover, when the ferroelectric material film includes hafnium oxide, the dopant included in the ferroelectric material film may include, for example, at least one of gadolinium (Gd), silicon (Si), zirconium (Zr), aluminum (Al), and yttrium (Y). And, when the dopant is aluminum (Al), the ferroelectric material film may include 3 to 8 at % (atomic %) aluminum. Here, a ratio of the dopant may be a ratio of aluminum to the sum of hafnium and aluminum. When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include, for example, at least one of a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film. The ferroelectric material film may have a thickness having the ferroelectric properties. The thickness of the ferroelectric material film may be, for example, but is not limited to, 0.5 to 10 nm. Since a critical thickness that exhibits the ferroelectric properties may vary for each ferroelectric material, the thickness of the ferroelectric material film may vary depending on the ferroelectric material.

As an example, the first gate insulating film 130 may include one ferroelectric material film. As another example, the first gate insulating film 130 may include a plurality of ferroelectric material films spaced apart from each other. The first gate insulating film 130 may have a stacked film structure in which the plurality of ferroelectric material films and the plurality of paraelectric material films are alternately stacked.

The gate spacer 140 may be placed on the side wall of the gate electrode 120. As an example, in FIG. 5, the gate spacer 140 placed on the first fin type pattern 110 may include an outer spacer 141 and an inner spacer 142. The inner spacer 142 may be placed between the sheet patterns NS adjacent to each other in the third direction D3. As another example, in FIG. 4, the gate spacer 140 placed on the first fin type pattern 110 may include only the outer spacer.

The gate spacer 140 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof. A gate capping pattern 145 may be placed on the gate electrode 120 and the gate spacer 140. An upper surface of the gate capping pattern 145 may be placed on the same plane as the upper surface of the first interlayer insulating film 190. Unlike that shown, the gate capping pattern 145 may be placed between the gate spacers 140. The gate capping pattern 145 may include, for example, at least one of silicon nitride (SiN), silicon oxynitride (SiON), silicon carbonitride (SiCN), silicon oxycarbonitride (SiOCN), and combinations thereof. The gate capping pattern 145 may include a material having an etching selectivity to the interlayer insulating film 190.

The source/drain pattern 150 may be placed on the first fin type pattern 110. The source/drain pattern 150 may be placed between the gate electrodes 120 adjacent to each other in the first direction D1. The source/drain pattern 150 may be connected to the sheet pattern NS adjacent thereto in the first direction D1. The source/drain pattern 150 may be included in a source/drain of a transistor that uses the sheet pattern NS1 as a channel region. The source/drain pattern 150 may be an epitaxial pattern formed by utilizing an epitaxial process.

In addition, an etching stop film 192 may be placed on the upper surface of the field insulating film 105, the side wall of the gate electrode 120, the upper surface of the source/drain pattern 150, and the side wall of the source/drain pattern 150. The etching stop film 192 may include a material having an etching selectivity to an interlayer insulating film 190 to be described below. The etching stop film 192 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

Next, the first interlayer insulating film 190 may be placed on the etching stop film 192. The first interlayer insulating film 190 may be placed on the field insulating film 105 and the source/drain pattern 150. The first interlayer insulating film 190 may not cover the upper surface of the gate capping pattern 145. For example, the upper surface of the first interlayer insulating film 190 may be placed on the same plane as the upper surface of the gate capping pattern 145. The first interlayer insulating film 190 may include, for example, at least one of silicon oxide, silicon nitride, silicon oxynitride, and a low dielectric constant material. The low dielectric constant material may include, but is not limited to, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylD-iSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first power supply source/drain contact 170 and the connection source/drain contact 171 may be placed on the first fin type pattern 110. Each of the first power supply source/drain contact 170 and the connection source/drain contact 171 may be placed on the first surface 100AS of the substrate. Advantageously, the first power supply/drain contact 170 connects a pair of first power rails 180 spaced apart in the second direction D2 about the first fin type pattern 110. The first power supply source/drain contact 170 may extend in the second direction D2. The connection source/drain contact 171 may not be connected to the first power rail 180.

The second power supply source/drain contact 175 may be placed on the second fin type pattern 210. The second power supply source/drain contact 175 may be placed on the first surface 100AS of the substrate. The second power supply source source/drain contact 175 connects a pair of second power rails 185 spaced apart in the second direction D2 around the second fin type pattern 210. The second power supply source/drain contact 175 may extend in the second direction D2. Although not shown, the connection source/drain contact that is not connected to the second power rail 185 may be placed on the second fin type pattern 210.

Since the description of the second power supply source/drain contact 175 is substantially the same as that of the first power supply source/drain contact 170, the following description will be provided mainly on the first power supply source/drain contact 170. However, if there are differences between the first power supply source/drain contact 170 and the second power supply source/drain contact 175, the differences will be briefly described.

Each of the first power supply source/drain contact 170 and the connection source/drain contact 171 may be placed on the source/drain pattern 150. Each of the first power supply source/drain contact 170 and the connection source/drain contact 171 may be connected to the source/drain pattern 150. In addition, each of the first power supply source/drain contact 170 and the connection source/drain contact 171 may overlap the source/drain pattern 150 in the third direction D3. That is, the source/drain pattern 150 and the first power supply source/drain contact 170 may be sequentially placed on the upper surface 110US of the first fin type pattern in the third direction D3.

Each of the first power supply source/drain contact 170 and the connection source/drain contact 171 may pass through the first interlayer insulating film 190 and the etching stop film 192, and be connected to the source/drain pattern 150. Although not shown, a metal silicide film may be further placed between the first power supply source/drain contact 170 and the source/drain pattern 150, and between the connection source/drain contact 171 and the source/drain pattern 150.

For example, although the upper surface of the first power supply source/drain contact 170 and the upper surface of the connection source/drain contact 171 are shown as being placed on the same plane as the upper surface of the first interlayer insulating film 190, the embodiment is not limited thereto. Further, although the upper surface of the first power supply source/drain contact 170 may be placed on the same plane as the upper surface of the gate capping pattern 145, the embodiment is not limited thereto.

The first power supply source source/drain contact 170 passes through the first interlayer insulating film 190 and the etching stop film 192, and is connected to the pair of first power rails 180. A part of the first power supply source source/drain contact 170 is placed inside the field insulating film 105. Alternatively, the lowermost surface of the first power supply source source/drain contact 170 is lower than the upper surface of the field insulating film 105.

The first power supply source/drain contact 170 is connected to the upper surface 180US of the first power rail. The first power supply source/drain contact 170 may be in contact with the first power rail 180. The upper surface 180US of the first power rail may be a boundary surface on which the first power rail 180 comes into contact with the first power supply source/drain contact 170. On the other hand, although not shown, the connection source/drain contact 171 is not connected to the pair of first power rails 180 through a part of the field insulating film 105, the first interlayer insulating film 190 and the etching stop film 192.

The first power supply source/drain contact 170 includes a horizontal part 170HP extending in the second direction D2, and a pair of vertical parts 170VP extending in the third direction D3. A schematic shape of the first power supply source/drain contact 170 may be, for example, a "U" shape rotated by 180 degrees.

The source/drain pattern 150 may be placed between the vertical parts 170VP of the pair of first power supply source/drain contacts. The vertical parts 170VP of each first power supply source/drain contact may be in contact with the corresponding first power rail 180. The vertical part 170VP of each first power supply source/drain contact may be in contact with the upper surface 180US of the first power rail.

A horizontal part 170HP of the first power supply source/drain contact may cover the upper surface of the source/drain pattern 150. The horizontal part 170HP of the first power supply source/drain contact is directly connected to the vertical parts 170VP of the pair of first power supply source/drain contacts spaced apart in the second direction D2. For example, the first power supply source/drain contact 170 may have an integral structure. In other words, the horizontal part 170HP of the first power supply source/drain contact and the vertical part 170VP of the first power supply source/drain contact are formed at the same time, and there may be no boundary surface between the horizontal part 170HP of the first power supply source/drain contact and the vertical part 170VP of the first power supply source/drain contact.

The first power supply source source/drain contact 170, the connection source/drain contact 171 and the second power supply source source/drain contact 175 each include a conductive material, and may include, for example, at least one of metal, metal nitride, metal carbonitride, a two-dimensional (2D) material and a conductive semiconductor material. Although the first power supply source/drain contact 170 and the connection source/drain contact 171 are each shown as a single film, this is only for convenience of explanation, and the embodiment is not limited thereto. As an example, the first power supply source/drain contact 170 and the connection source/drain contact 171 may include a contact barrier film, and a contact filling film that fills the space defined by the contact barrier film. As another example, the first power supply source/drain contact 170 and the connection source/drain contact 171 may include only a contact filling film without a contact barrier film.

The second interlayer insulating film 191 may be placed on the first interlayer insulating film 190. The second interlayer insulating film 191 may be placed on the first power supply source/drain contact 170, the connection source/drain contact 171, and the second power supply source/drain contact 175. In some embodiments, the second interlayer insulating film 191 may include, for example, at least one of silicon oxide, silicon nitride, silicon oxynitride, and a low dielectric constant material.

A wiring line 195 and a connecting via 196 may be placed in the second interlayer insulating film 191. The connecting via 196 may connect the wiring line 195 to the connection source/drain contact 171. The wiring line 195 and the connecting via 196 may be formed through different fabricating processes from each other. A boundary surface may exist between the wiring line 195 and the connecting via 196. Unlike that shown, as an example, the wiring line 195 and the connecting via 196 may have an integral structure. In such cases, the boundary between the wiring line 195 and the connecting via 196 may not be distinguished. As another example, unlike that shown, the wiring line 195 may be connected to the connection source/drain contact 171 without the connecting via 196.

The wiring line 195 and the connecting via 196 each include a conductive material, and may include for example, at least one of metal, metal nitride, metal carbonitride, a two-dimensional (2D) material, and a conductive semiconductor material. A through via 200 may penetrate the substrate 100. The through via 200 is connected to a pair of first power rails 180. Although not shown, the other through via 200 is connected to a pair of second power rails 185. The through via 200 may extend in the third direction D3. The through via 200 may extend from the second surface 100BS of the substrate to the first power rail 180. The through via 200 may be connected to a bottom surface 180BS of the first power rail. A width of the through via 200 may be reduced as it goes away from the second surface 100BS of the substrate.

The upper surface of the through via 200 may be located on the second surface 100BS of the substrate. The bottom surface of the through via 200 may be a surface that is opposite to the upper surface of the through via 200 in the third direction D3. For example, the bottom surface of the through via 200 may protrude upward from the bottom surface of the rail trench 180RT. In other words, a depth from the first surface 100AS of the substrate to the bottom surface of the through via 200 may be smaller than a depth from the first surface 100AS of the substrate to the bottom surface of the rail trench 180RT.

Although the through via 200 is shown as being placed at a position where it overlaps the first power supply source/drain contact 170 in the third direction D3, this is only for convenience of explanation, and the embodiment is not limited thereto. The through via 200 includes a conductive material, and may include, for example, at least one of metal, metal nitride, metal carbonitride, a two-dimensional (2D) material, and a conductive semiconductor material. Although not shown, a wiring structure connected to the through via 200 may be further placed on the second surface 100BS of the substrate.

Figure 6:
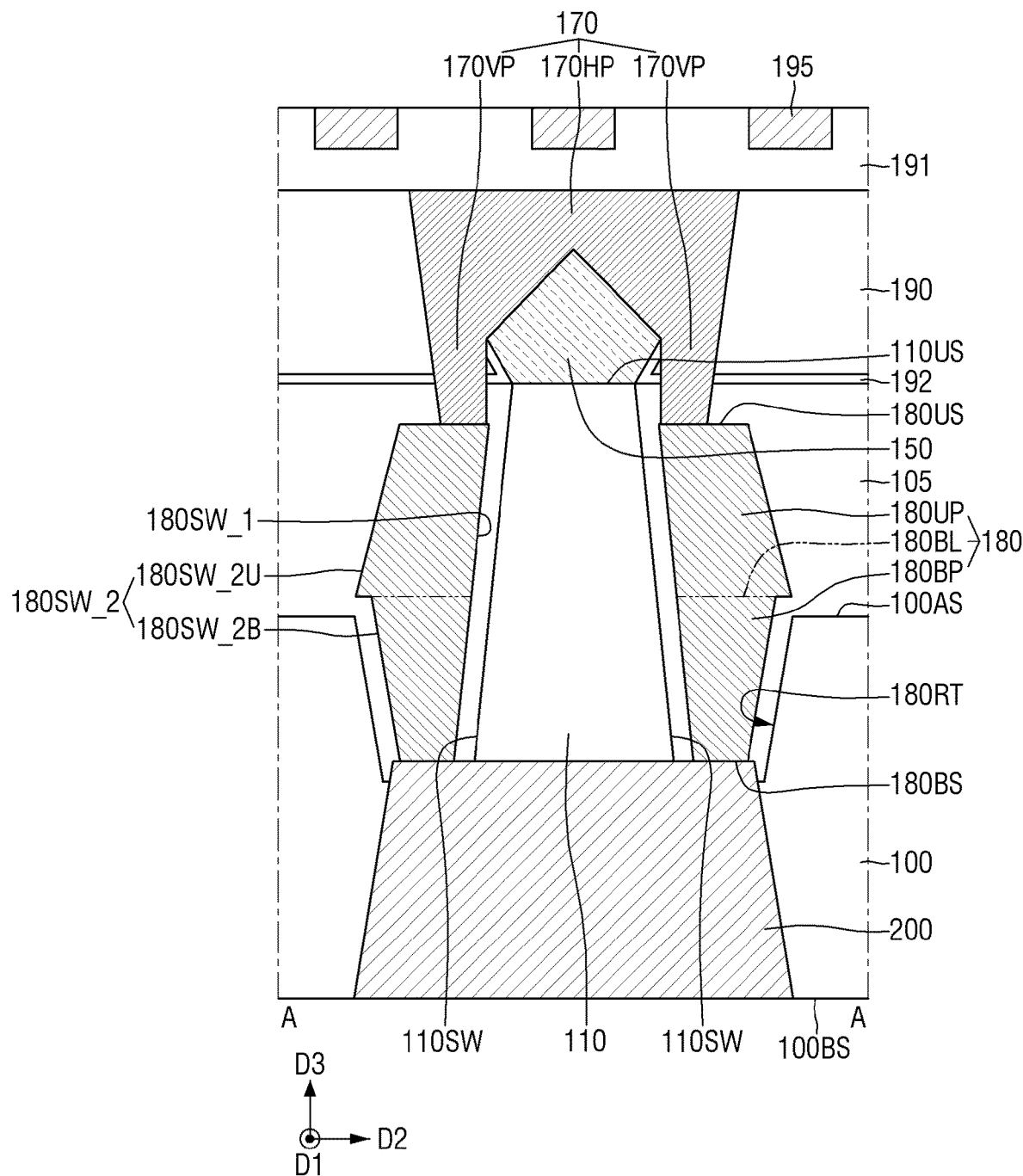
FIGS. 6-7 are cross-sectional views of semiconductor devices according to alternative embodiments of the invention.
Figure 7:
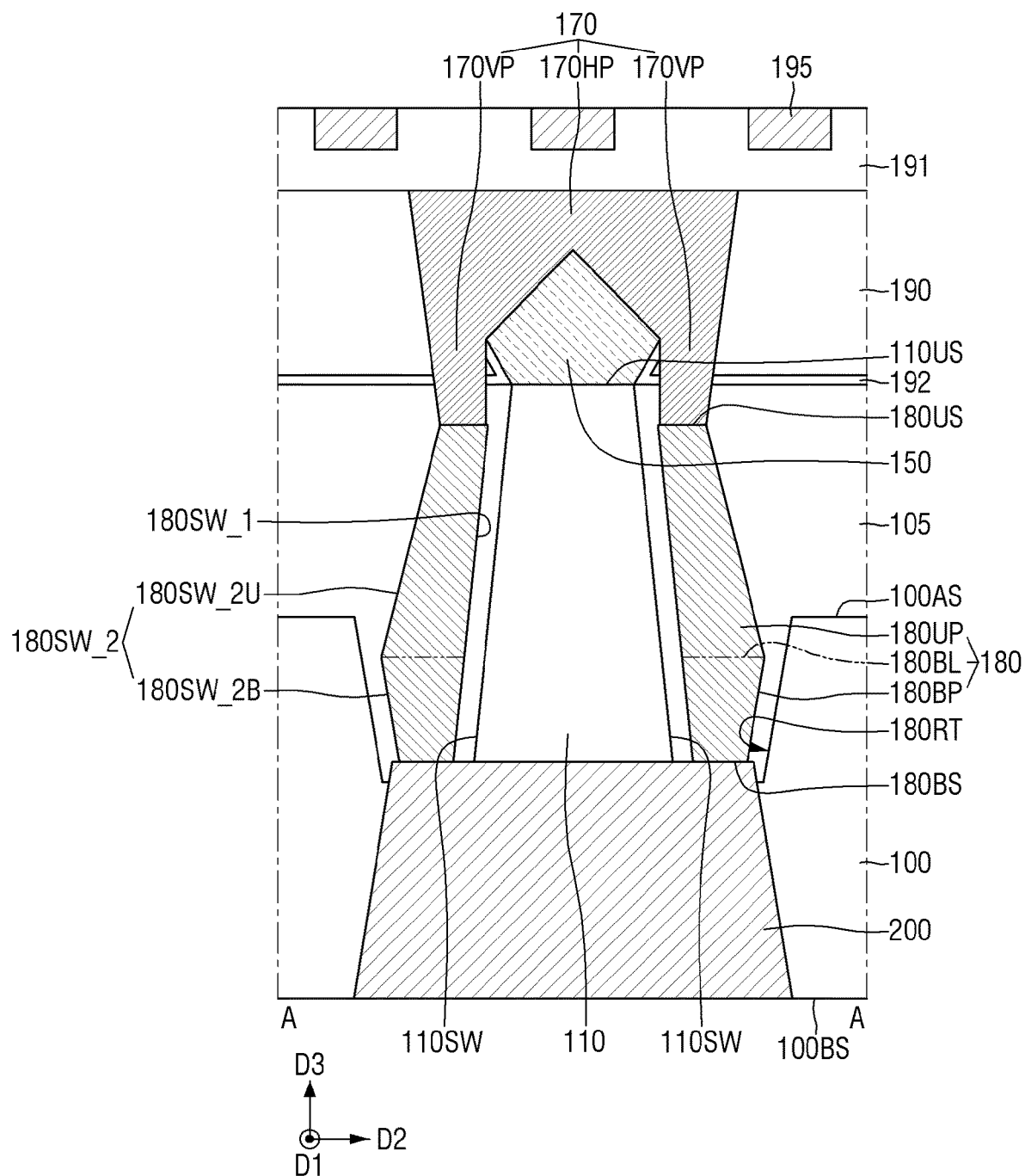

FIGS. 6 and 7 are diagrams for explaining a semiconductor device according to some embodiments, respectively. For convenience of explanation, the points different from those described using FIGS. 1 to 5 will be mainly described. Referring to FIG. 6, in the semiconductor device according to some embodiments, the width of the lower part 180BP of the first power rail at the boundary line 180BL of the first power rail is different from the width of the upper part 180UP of the first power rail. At the boundary line 180BL of the first power rail, the width of the upper part 180UP of the first power rail is greater than the width of the lower part 180BP of the first power rail.

Referring to FIG. 7, in the semiconductor device according to some embodiments, the boundary line 180BL of the first power rail may be placed below the first surface 100AS of the substrate. The lower part 180BP of the first power rail may be entirely placed inside the rail trench 180RT. A part of the upper part 180UP of the first power rail is placed in the rail trench 180RT, and the rest of the upper part 180UP of the first power rail protrudes upward from the first surface 100AS of the substrate. Unlike that shown, the boundary line 180BL of the first power rail may be located at the same level as the first surface 100AS of the substrate.

Figure 8:
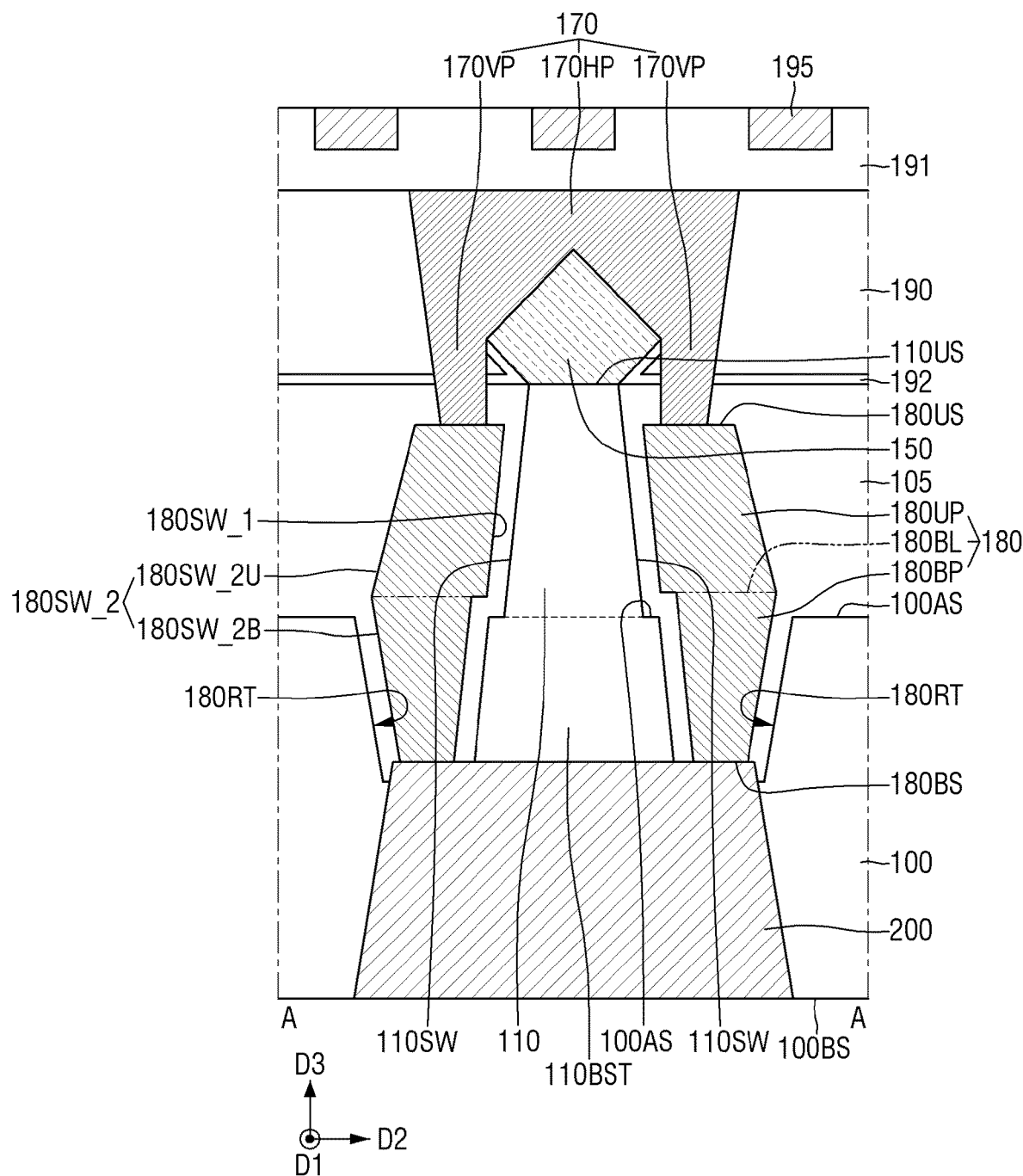
FIG. 8 is a cross-sectional view of a semiconductor device according to an additional embodiment of the invention.

FIG. 8 is a diagram for explaining a semiconductor device according to some embodiments. For convenience of explanation, the points different from those described using FIGS. 1 to 5 will be mainly described. Referring to FIG. 8, in the semiconductor device according to some embodiments, a pair of rail trenches 180RT may be placed on both sides of the first fin type pattern 110.

The first fin type pattern 110 may be placed between rail trenches 180RT adjacent to each other in the second direction D2. Each rail trench 180RT is retracted from the first surface 100AS of the substrate toward the second surface 100BS of the substrate. A pair of rail trenches 180RT may define a lower structure 110BST of the first fin type pattern.

The first fin type pattern 110 may protrude from the lower structure 110BST of the first fin type pattern. An upper surface of the lower structure 110BST of the first fin type pattern may be the first surface 100AS of the substrate. The first surface 100AS of the substrate may be located between the side wall 110SW of the first fin type pattern and the side wall of the rail trench 180RT.

The first fin type pattern 110 may protrude from the first surface 100AS of the substrate located between the rail trenches 180RT adjacent to each other in the second direction D2. In other words, the first pin type pattern 110 is not placed in the rail trench 180RT. A part of each first power rail 180 is placed inside the corresponding rail trench 180RT.

Since the first surface 100AS of the substrate is located between the side wall 110SW of the first fin type pattern and the side wall of the rail trench 180RT, at the boundary 180BL of the first power rail, the width of the lower part 180BP of the power rail may differ from the width of the upper part 180UP of the first power rail. For example, at the boundary line 180BL of the first power rail, the width of the upper part 180UP of the first power rail is greater than the width of the lower part 180BP of the first power rail.

Figure 9:
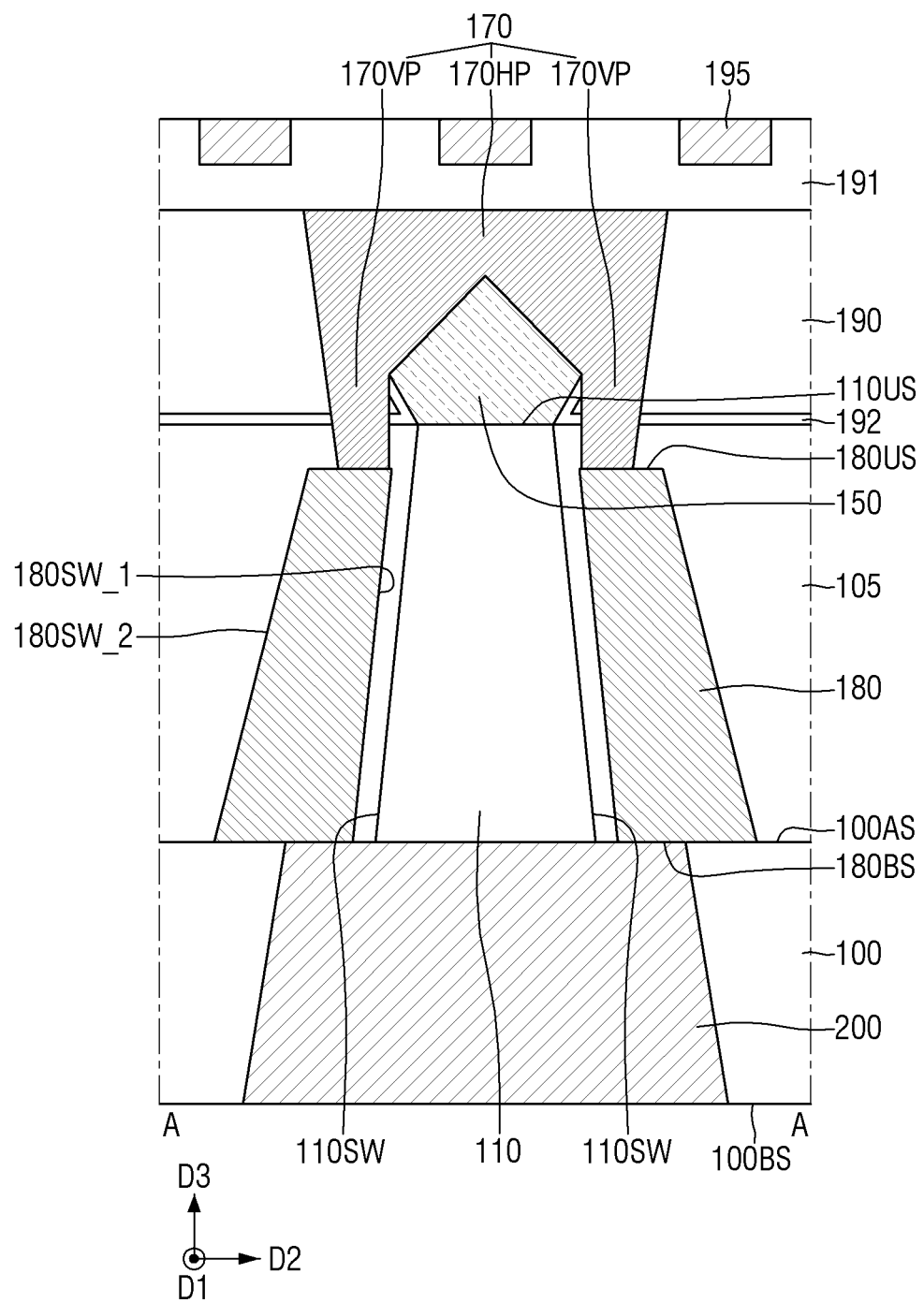
FIG. 9 is a cross-sectional view of a semiconductor device according to an additional embodiment of the invention.

FIG. 9 is a diagram for explaining the semiconductor device according to some embodiments. For convenience of explanation, the points different from those described using FIGS. 1 to 5 will be mainly described. Referring to FIG. 9, in the semiconductor device according to some embodiments, a direction in which the second side wall 180SW_2 of the first power rail inclines may be the same as the direction in which the side wall 110SW of the first fin type pattern inclines. The sign (e.g., +/−) of the inclination of the second side wall 180SW_2 of the first power rail may be the same as the sign of the inclination of the side wall 110SW of the first fin type pattern.

The substrate 100 may not include the rail trench (180RT of FIG. 2). The bottom surface 180BS of the first power rail may be placed on the first surface 100AS of the substrate. Unlike that shown, the substrate 100 may include a rail trench (180RT of FIG. 2). When the first power rail 180 entirely overlaps the bottom surface of the rail trench (180RT of FIG. 2) in the third direction D3, the sign of the inclination of the second side wall 180SW_2 of the first power rail may be the same as the sign of the inclination of the side wall 110SW of the first fin type pattern.

Figure 10:
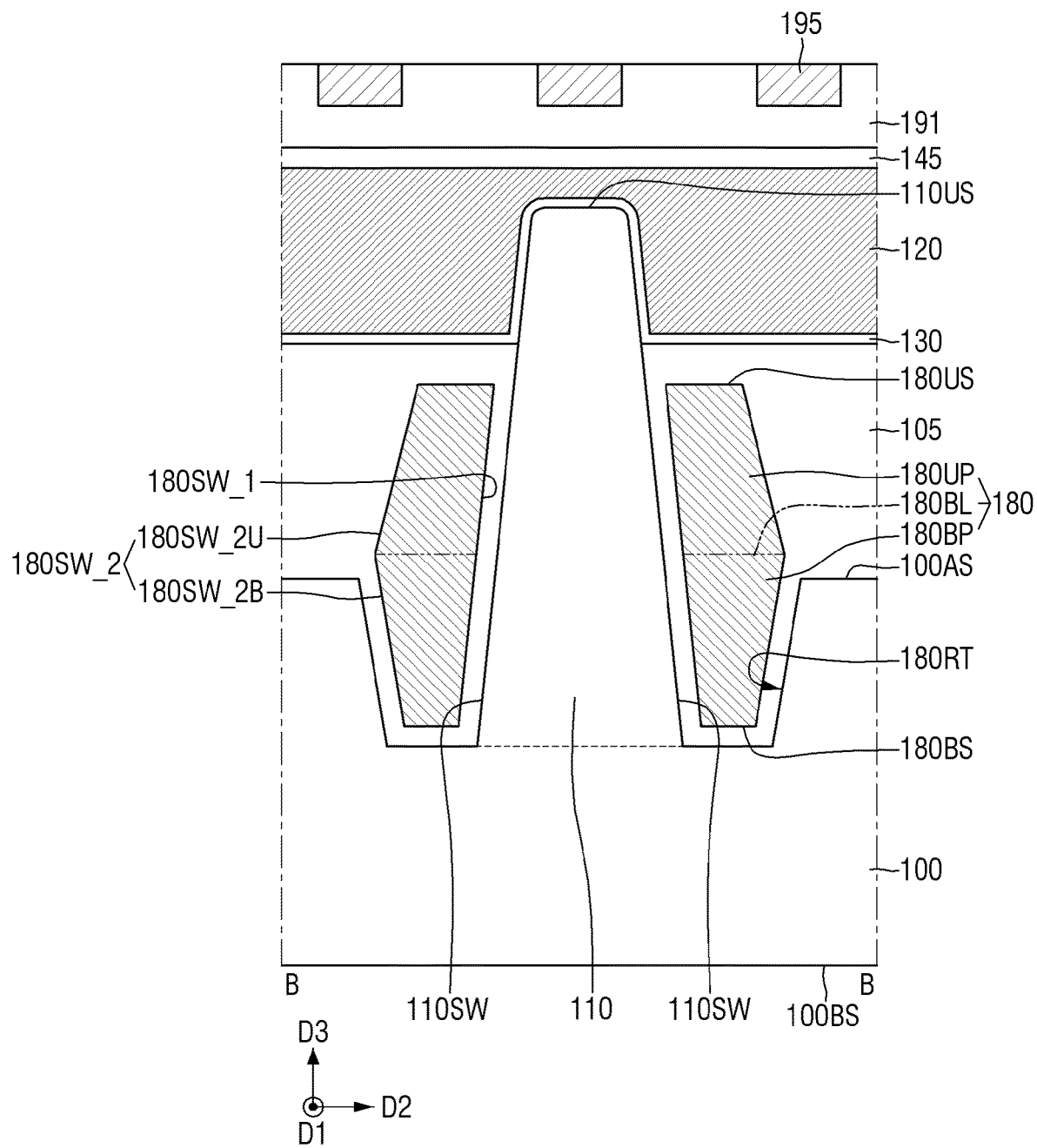
FIG. 10 is a cross-sectional view of a semiconductor device according to an additional embodiment of the invention.

FIG. 10 is a diagram for explaining a semiconductor device according to some embodiments. For convenience of explanation, the points different from those described using FIGS. 1 to 5 will be mainly described. Referring to FIG. 10, in the semiconductor device according to some embodiments, the gate electrode 120 covers a first fin type pattern 110 that protrudes upward from the upper surface of the field insulating film 105.

The first fin type pattern 110 that protrudes upward from the upper surface of the field insulating film 105 may be used as a channel region of a transistor. In other words, a fin type transistor may be defined at an intersection point between the first fin type pattern 110 and the gate electrode 120. The first fin type pattern 110 and the second fin type pattern 210 may be used as the channel region of the transistor. As an example, the first fin type pattern 110 and the second fin type pattern 210 may include the same semiconductor material. For example, the first fin type pattern 110 and the second fin type pattern 210 may each be a silicon fin type pattern.

As another example, the first fin type pattern 110 and the second fin type pattern 210 may include semiconductor materials different from each other. When the first fin type pattern 110 is placed in a PMOS formation region and the second fin type pattern 210 is placed in an NMOS formation region, the first fin type pattern 110 may be a silicon-germanium fin type pattern, and the second fin type pattern 210 may be a silicon fin type pattern. However, the embodiments are not limited thereto.

Figure 11:
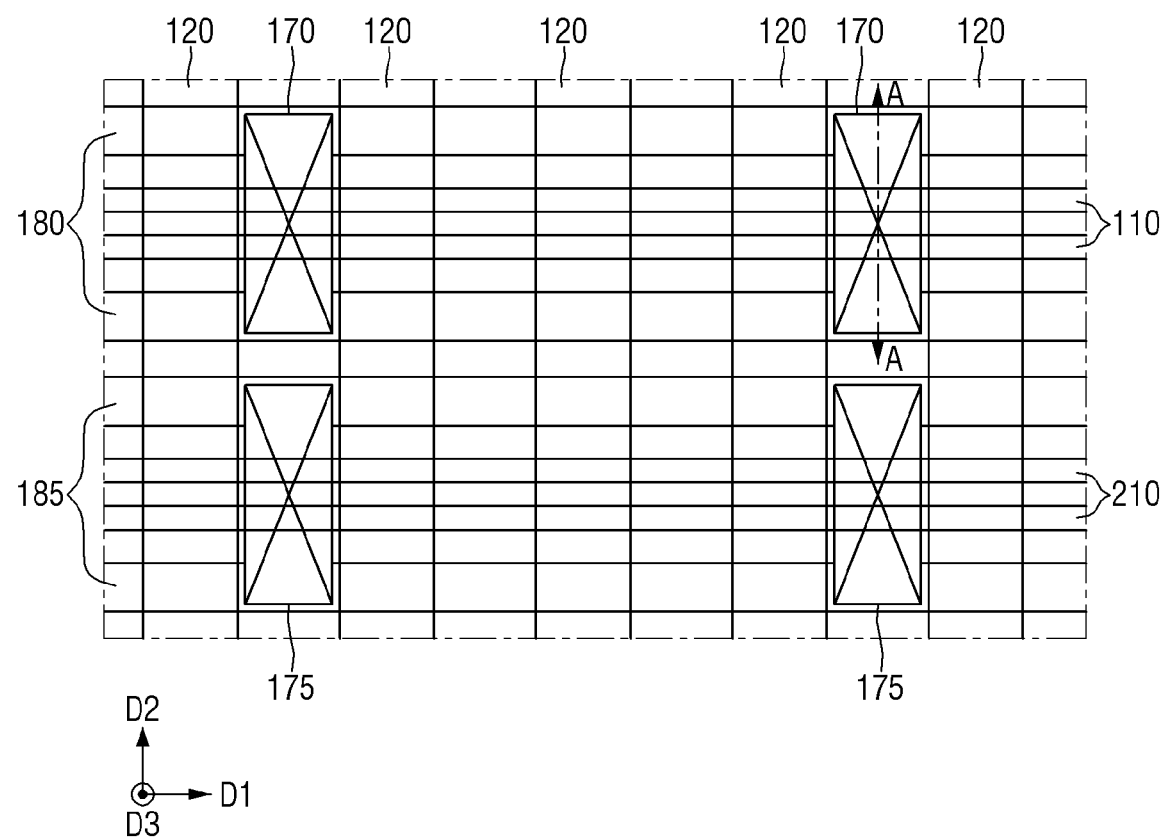
FIG. 11 is a plan layout diagram of a semiconductor device according to an embodiment of the invention.
Figure 12:
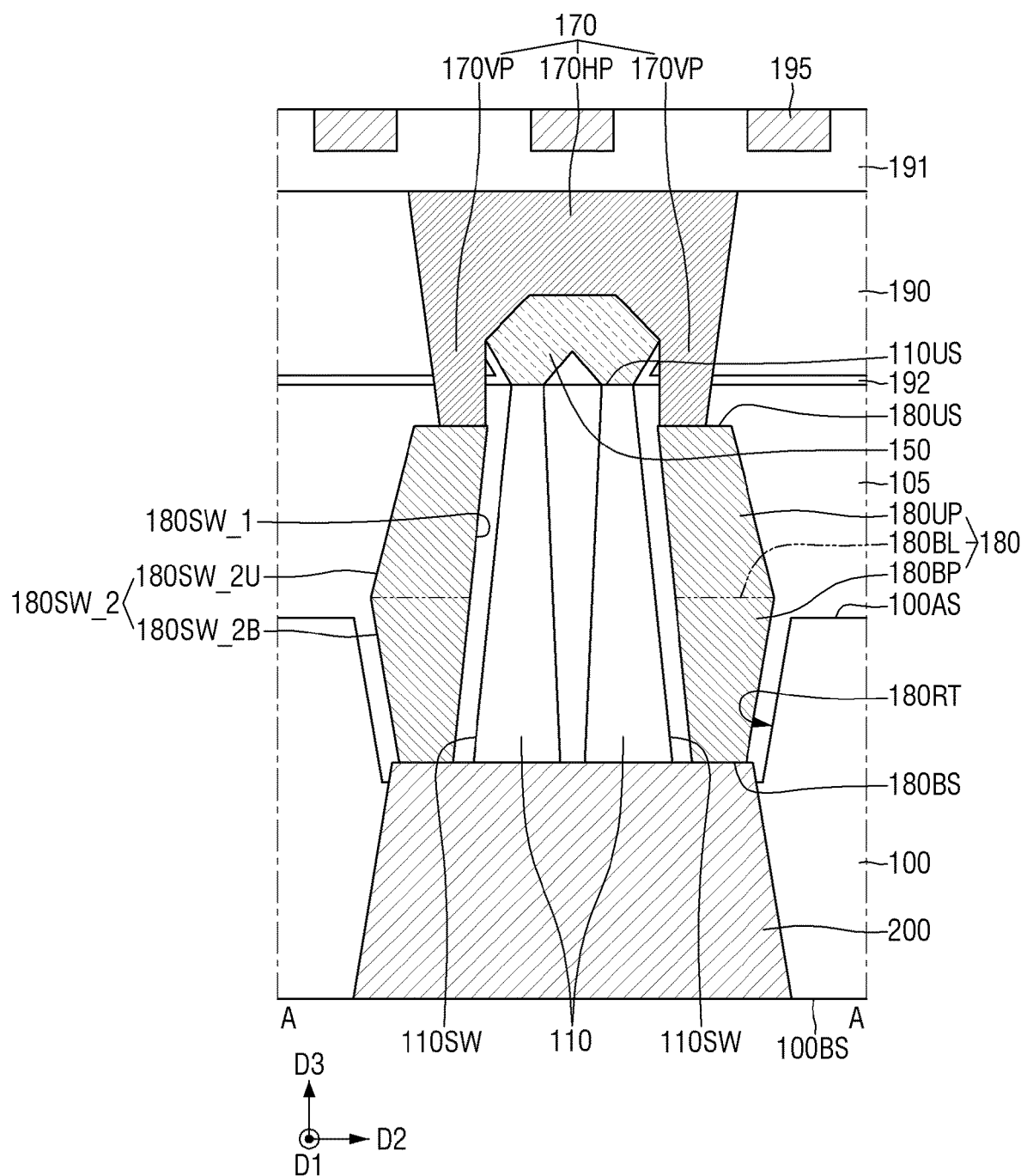
FIG. 12 is a cross-sectional view of the semiconductor device of FIG. 11, taken along line A-A of FIG. 11.

FIG. 11 is a layout diagram for explaining a semiconductor device according to some embodiments. FIG. 12 is an exemplary diagram taken along A-A of FIG. 11. For convenience of explanation, the points different from those described using FIGS. 1 to 5 will be mainly described. Referring to FIGS. 11 and 12, in the semiconductor device according to some embodiments, a plurality of fin type patterns 110 may be placed between the pair of first power rails 180 spaced apart from each other in the second direction D2. A plurality of second fin type patterns 210 may be placed between a pair of second power rails 185 spaced apart from each other in the second direction D2. In contrast, the plurality of first fin type patterns 110 may protrude from the bottom surface of the rail trench 180RT. A part of each first fin type pattern 110 is placed inside the rail trench 180RT. The rest of each first fin type pattern 110 protrudes upward from the first surface 100AS of the substrate. A part of the field insulating film 105 may be interposed between the first fin type patterns 110 adjacent to each other in the second direction D2. The side walls 110SW of the first fin type pattern facing each other extend downward from the first surface 100AS of the substrate. The source/drain pattern 150 may be a shared source/drain pattern connected to the upper surface 110US of a plurality of first fin type patterns.

Although two first fin type patterns 110 are shown as being placed between a pair of second power rails 185 spaced apart from each other in the second direction D2, this is only for convenience of explanation, and the embodiment is not limited thereto. Although not shown, as an example, a sheet pattern NS as shown in FIG. 3 may be placed on the upper surface 110US of each first fin type pattern. As another example, as described in FIG. 10, a part of each first fin type pattern 110 may protrude from the upper surface of the field insulating film 105. Each first fin type pattern 110 protruding from the upper surface of the field insulating film 105 may be used as a channel region of the transistor.

Figure 13:
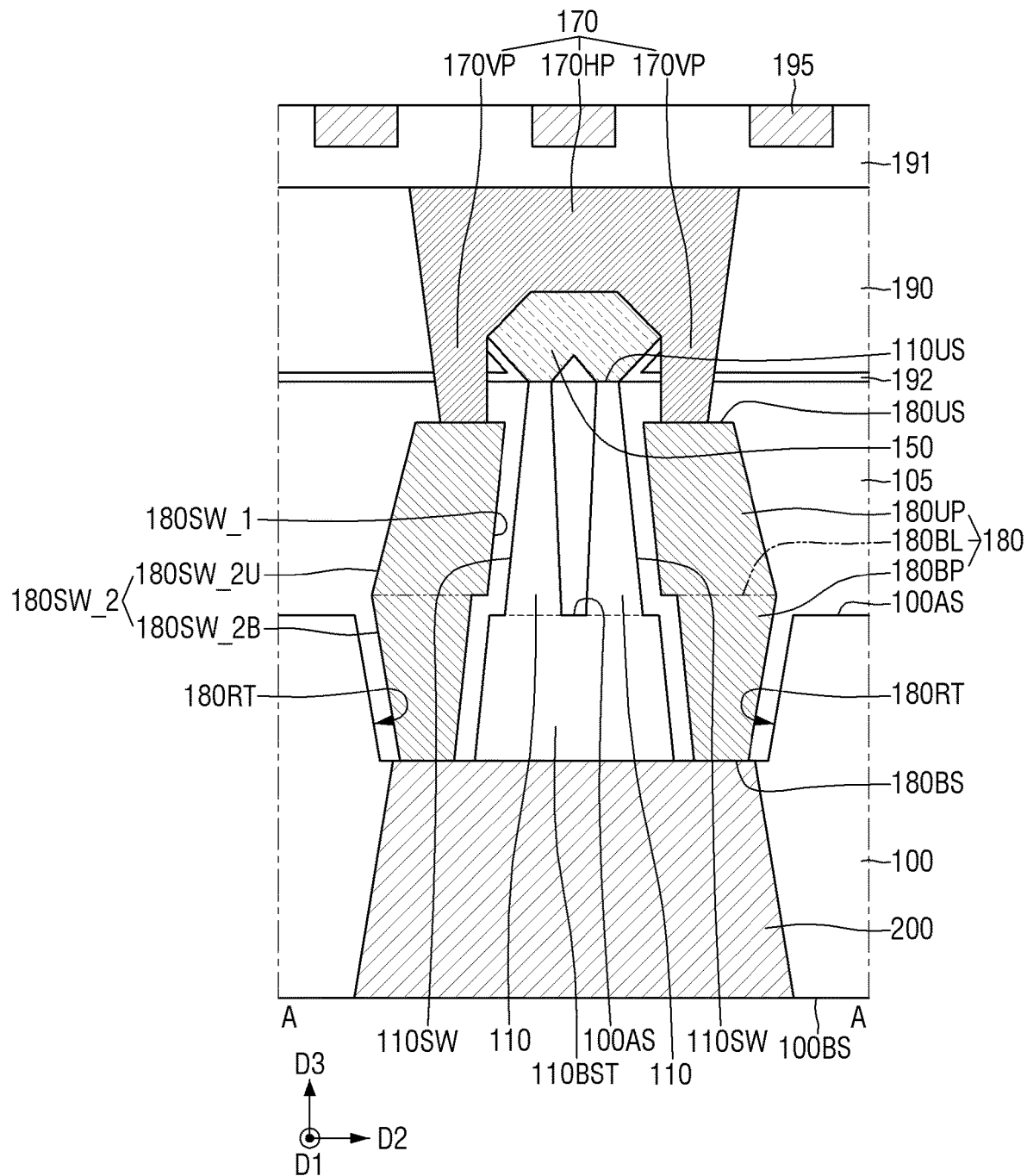
FIG. 13 is a cross-sectional view of a semiconductor device according to an additional embodiment of the invention.

FIG. 13 is a diagram for explaining a semiconductor device according to some embodiments. For convenience of explanation, the points different from those described using FIGS. 11 and 12 will be mainly described. Referring to FIG. 13, a pair of rail trenches 180RT may be formed inside the substrate 100 with a plurality of first fin type patterns 110 interposed between them. The plurality of first fin type patterns 110 may be placed between the rail trenches 180RT adjacent to each other in the second direction D2. A pair of rail trenches 180RT may define a lower structure 110BST of the first fin type pattern.

The plurality of first fin type patterns 110 may protrude from the lower structure 110BST of the first fin type pattern. The upper surface of the lower structure 110BST of the first fin type pattern may be the first surface 100AS of the substrate. The first surface 100AS of the substrate may be located between the side wall 110SW of the first fin type pattern and the side wall of the rail trench 180RT. The first surface 100AS of the substrate may be located between the first fin type patterns adjacent to each other in the second direction D2.

The plurality of first fin type patterns 110 may protrude from the first surface 100AS of the substrate located between the rail trenches 180RT adjacent to each other in the second direction D2. In other words, each first fin type pattern 110 is not placed inside the rail trench 180RT. Since the first surface 100AS of the substrate is located between the side wall 110SW of the first fin type pattern placed on the outermost part and the side wall of the rail trench 180RT, at the boundary line 180BL of the first power rail, the width of the lower part 180BP of the first power rail is smaller than the width of the upper part 180UP of the first power rail.

Figure 14:
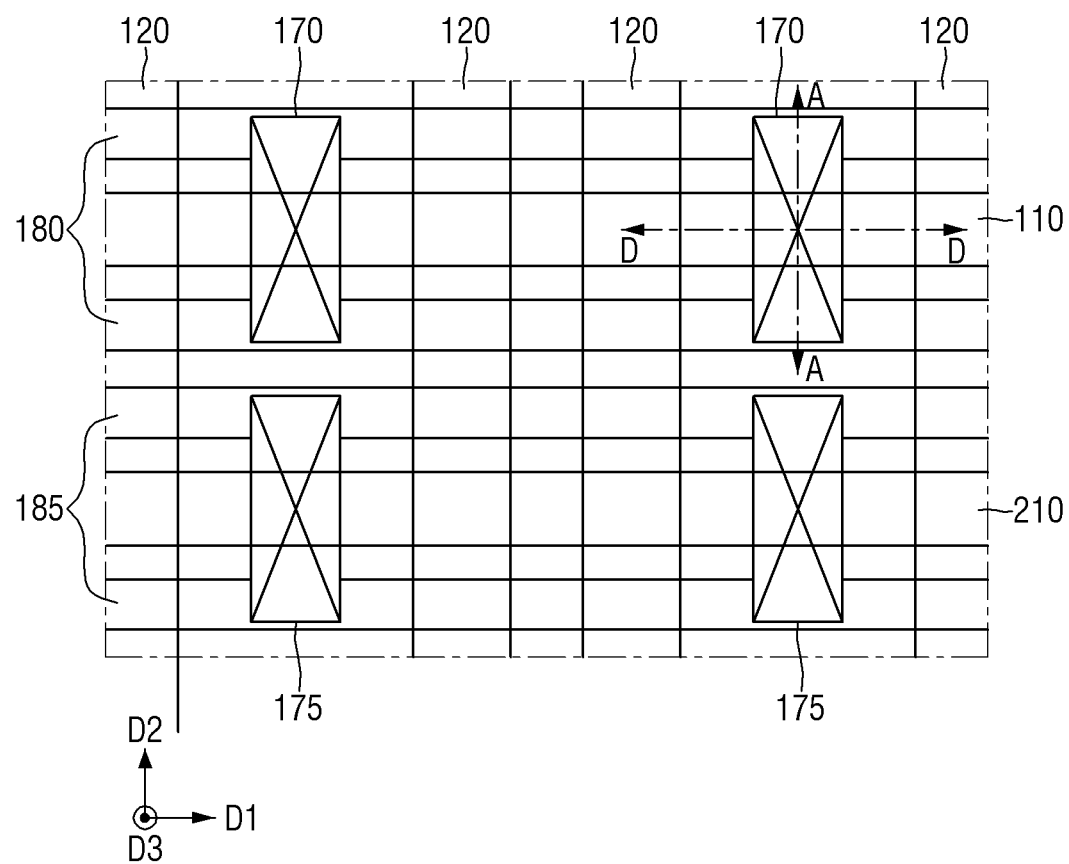
FIG. 14 is a plan layout diagram of a semiconductor device according to an embodiment of the invention.
Figure 15:
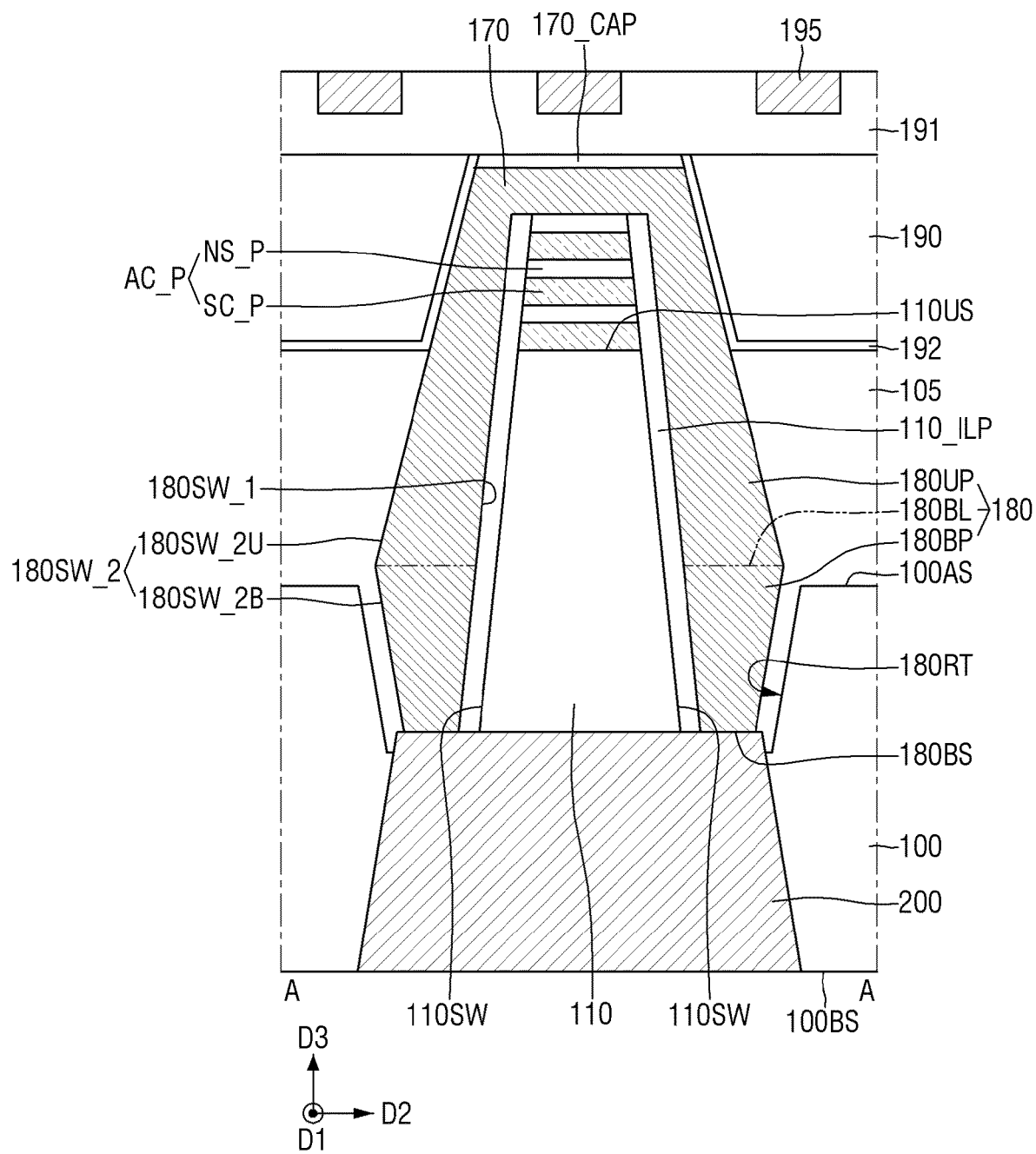
FIG. 15 is a cross-sectional view of the semiconductor device of FIG. 14, taken along line A-A of FIG. 14.
Figure 16:
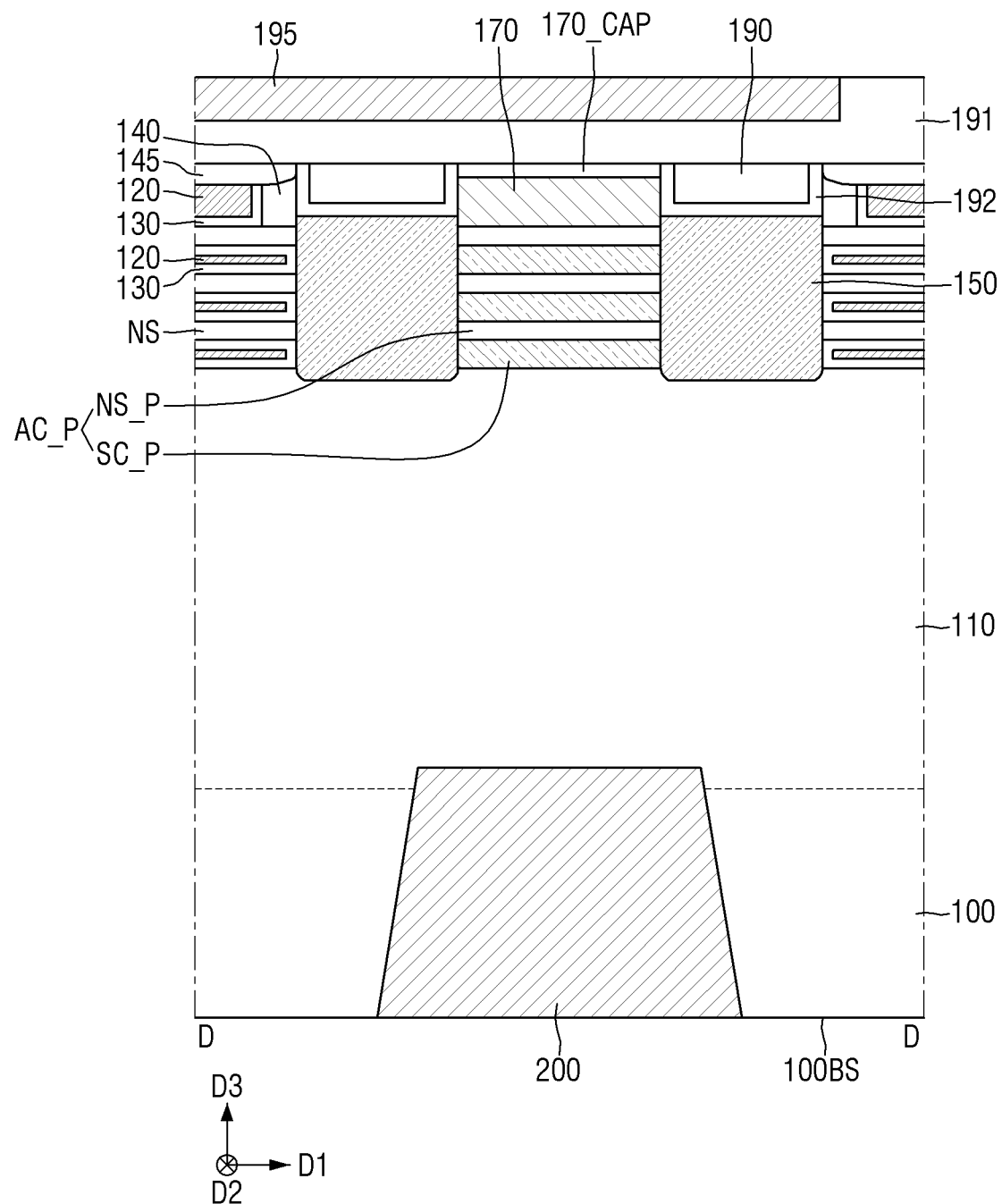
FIG. 16 is a cross-sectional view of the semiconductor device of FIG. 14, taken along line D-D of FIG. 14.

FIG. 14 is a layout diagram for explaining a semiconductor device according to some embodiments. FIG. 15 is an exemplary diagram taken along A-A of FIG. 14. FIG. 16 is an exemplary diagram taken along D-D of FIG. 14. For convenience of explanation, the points different from those described using FIGS. 1 to 5 will be mainly described. Referring to FIGS. 14 and 16, in the semiconductor device according to some embodiments, the pair of first power rails 180 and the first power supply source/drain contact 170 may have an integral structure. The pair of second power rails 185 and the second power supply source/drain contact 175 may have an integral structure. Thus, there is no boundary surface between the pair of first power rails 180 and the first power supply source/drain contact 170. The pair of first power rails 180 and the first power supply source/drain contact 170 that are integrated are formed of the same material. In the integral structure of the first power rails 180 and the first power supply source/drain contact 170, a portion protruding upward from the upper surface of the field insulating film 105 may be defined as the first power supply source/drain contact 170. In the integral structure of the first power rails 180 and the first power supply source/drain contact 170, a portion placed below the upper surface of the field insulating film 105 may be defined as the first power rail 180.

An active pattern AC_P may be placed on the first fin type pattern 110. The active pattern AC_P may include, for example, a sheet portion NS_P and a sacrificial portion SC_P that are alternately placed on the upper surface 110US of the first fin type pattern. The sheet portion NS_P may be placed at a height corresponding to the sheet pattern NS. For example, although the sheet portion NS_P may include silicon, and the sacrificial portion SC_P may include silicon-germanium, the embodiment is not limited thereto. The source/drain patterns 150 may be placed on either side of the active pattern AC_P. The active pattern AC_P may be directly connected to the source/drain pattern 150.

The first power supply source/drain contact 170 is not placed on the source/drain pattern 150. The first power supply source/drain contact 170 is placed on the active pattern AC_P. The first power supply source/drain contact 170 may overlap the active pattern AC_P in the third direction D3. The first power supply source source/drain contact 170 is adjacent to the source/drain pattern 150 in the first direction D1. The source/drain pattern 150 may be connected horizontally rather than vertically to the first power supply source/drain contact 170. A part of the source/drain pattern 150 may be connected to the first power rail 180 through the first source/drain pattern 150 that does not overlap the first power supply source source/drain contact 170 in the third direction D3.

The source/drain pattern 150 is placed between the first power supply source/drain contact 170 placed on the active pattern AC_P and the gate electrode 120.

A contact capping film 170_CAP may be placed on the first power supply source/drain contact 170. In the fabricating process performed after forming the first power rail 180 and the first power supply source/drain contact 170, the contact capping film 170_CAP may protect the first power supply source/drain contact 170. The contact capping film 170_CAP may include, for example, an insulating material. Although an upper surface of the contact capping film 170_CAP may be placed on the same plane as the upper surface of the first interlayer insulating film 191 and the upper surface of the gate capping pattern 145, the embodiment is not limited thereto.

A fin liner 110_ILP may be placed along the side wall of the first fin type pattern 110SW and the side wall of the active pattern AC_P. The fin liner 110_ILP may include, for example, an insulating material. Unlike that shown, the first fin type pattern 110 that protrudes upward from the upper surface of the field insulating film 105 may be located in a portion that overlaps the first power supply source source/drain contact 170 in the third direction D3. In such a case, the first fin type pattern 110 is used as a channel region of a transistor.

Figure 17:
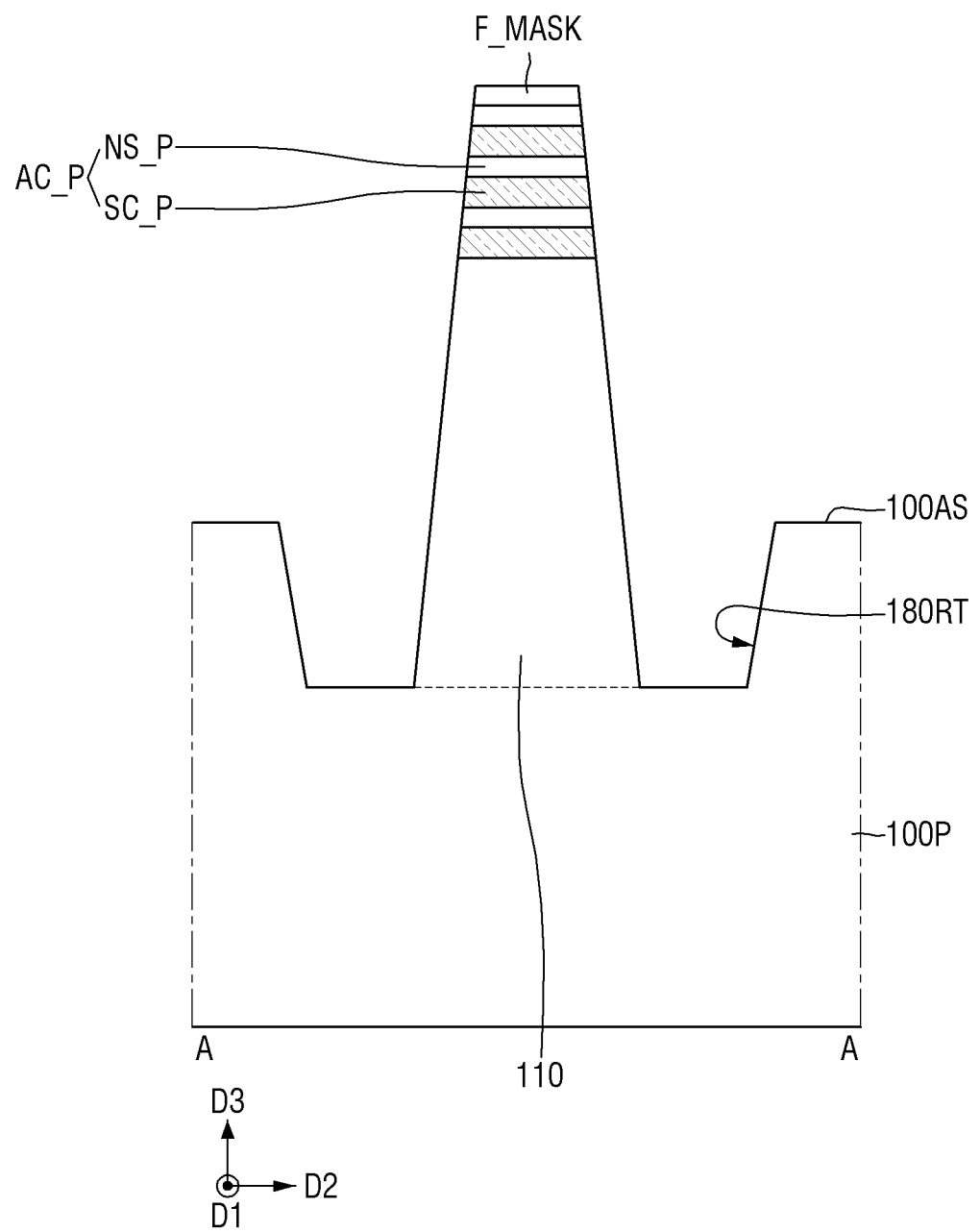
FIGS. 17-22 are cross-sectional views that illustrate intermediate process steps within methods of forming semiconductor devices according to some embodiments of the invention.

FIGS. 17 to 22 are intermediate stage diagrams for explaining a method for fabricating a semiconductor device according to some embodiments. FIGS. 17 to 22 may be cross-sectional views taken along A-A of FIG. 1. Referring to FIG. 17, the first fin type pattern 110 protruding upward from the first surface 100AS of the pre substrate 100P may be formed, using a fin mask F_MASK. The upper surface of the first fin type pattern 110 is higher than the first surface 100AS of the pre substrate 100P.

An active pattern AC_P may be placed on the first fin type pattern 110. The active pattern AC_P may include, for example, a sheet portion NS_P and a sacrificial portion SC_P that are alternately placed on the upper surface 110US of the first fin type pattern. The first fin type pattern 110 may protrude from the bottom surface of the rail trench 180RT. Unlike that shown, a pair of rail trenches 180RT may be formed on either side of the first fin type pattern 110.

More specifically, some of the active film and the pre substrate 100P may be etched through a first etching process using the fin mask F_MASK. Accordingly, at least a part of the first fin type pattern 110 and the active pattern AC_P may be formed. The first surface 100AS of the pre substrate 100P may be defined through the first etching process. The first surface 100AS of the pre substrate 100P becomes the first surface 100AS of the substrate later.

As an example, a trench mask pattern may be formed on the first surface 100AS of the pre substrate 100P. The trench mask pattern may have an opening that overlaps the fin mask F_MASK in the third direction D3. A rail trench 180RT may be formed in the pre substrate 100P through a second etching process using the trench mask pattern. While the rail trench 180RT is being formed, a part of the substrate 100 that overlaps the active pattern AC_P is also etched. Accordingly, the first fin type pattern 110 protruding from the bottom surface of the rail trench 180RT may be formed.

As another example, the trench mask pattern may have a plurality of openings that do not overlap the fin mask F_MASK in the third direction D3. The plurality of openings may be spaced apart from each other in the second direction D2 with the fin mask F_MASK interposed between them. A plurality of rail trenches 180RT may be formed in the substrate 100 through the second etching process using the trench mask pattern. In such a case, unlike that shown, the lower structure 110BST of the first fin type pattern defined by the rail trench 180RT may be formed as in FIG. 8. Unlike that shown, the active pattern AC_P may not be placed on the first fin type pattern 110. The first fin type pattern 110 may be used as the channel region of the transistor.

Figure 18:
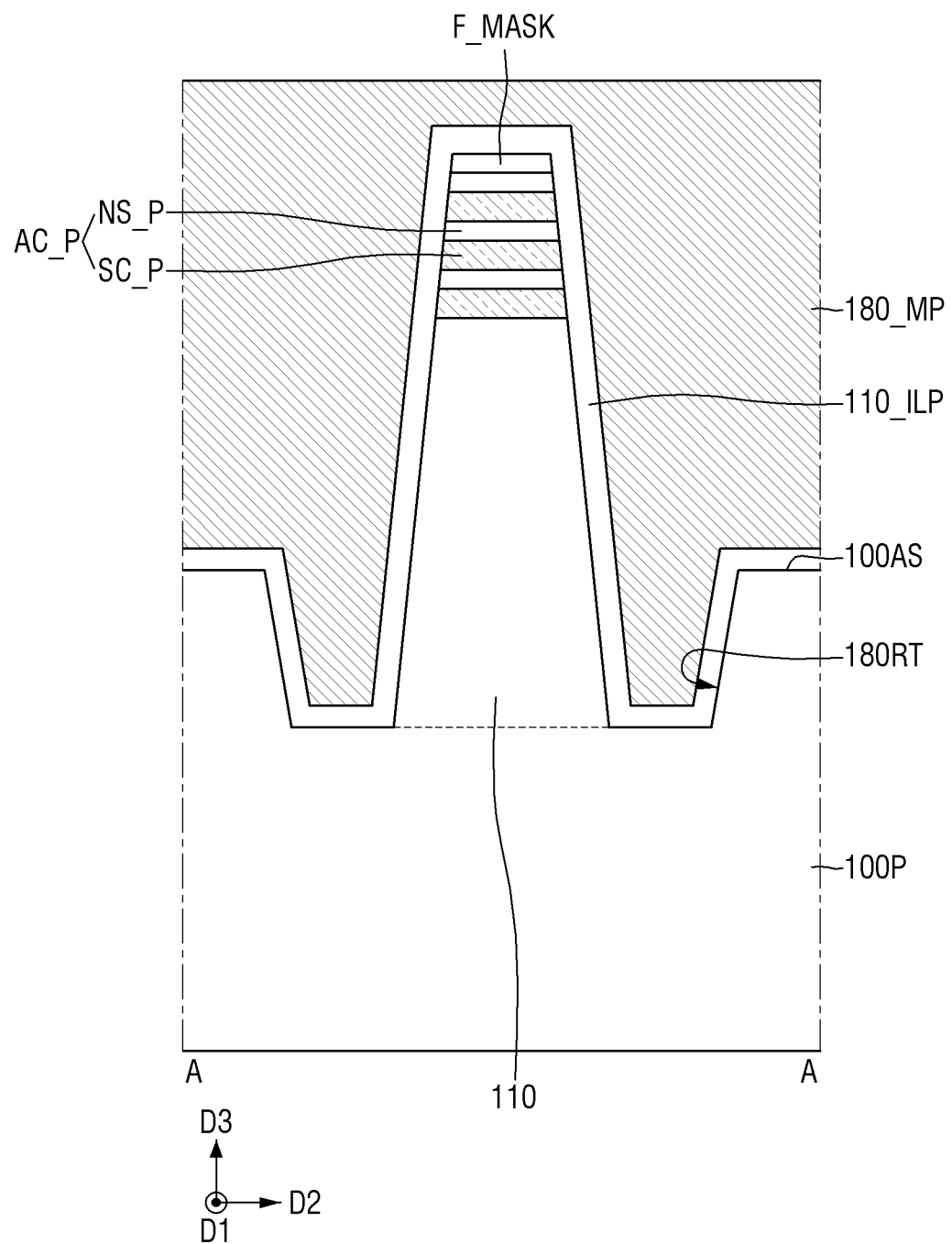

Referring to FIG. 18, a fin liner 110_ILP may be formed along the profiles of the first fin type pattern 110 and the active pattern AC_P, and the side wall and bottom surface of the rail trench 180RT. A rail conductive film 180_MP that fills the rail trench 180RT may be formed on the fin liner 110_ILP. The rail conductive film 180_MP is also formed on the first surface 100AS of the pre substrate 100P.

Figure 19:
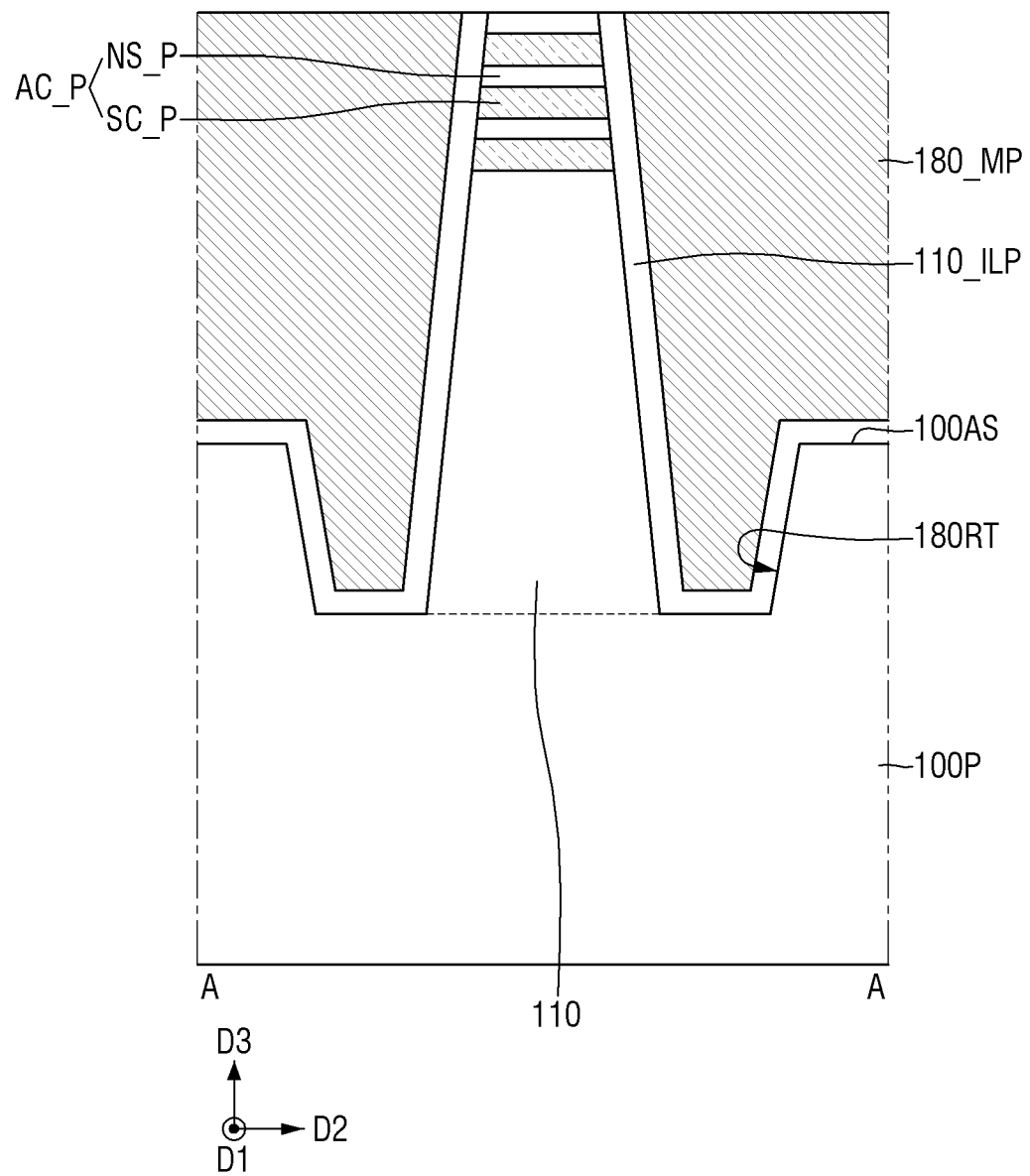

Referring to FIG. 19, a part of the rail conductive film 180_MP and the fin liner 110_ILP on the upper surface of the active pattern AC_P may be removed. After removing the fin liner 110_ILP on the upper surface of the active pattern AC_P, the fin mask F_MASK may be removed. Unlike that shown, the fin mask F_MASK on the upper surface of the active pattern AC_P may not be removed.

Figure 20:
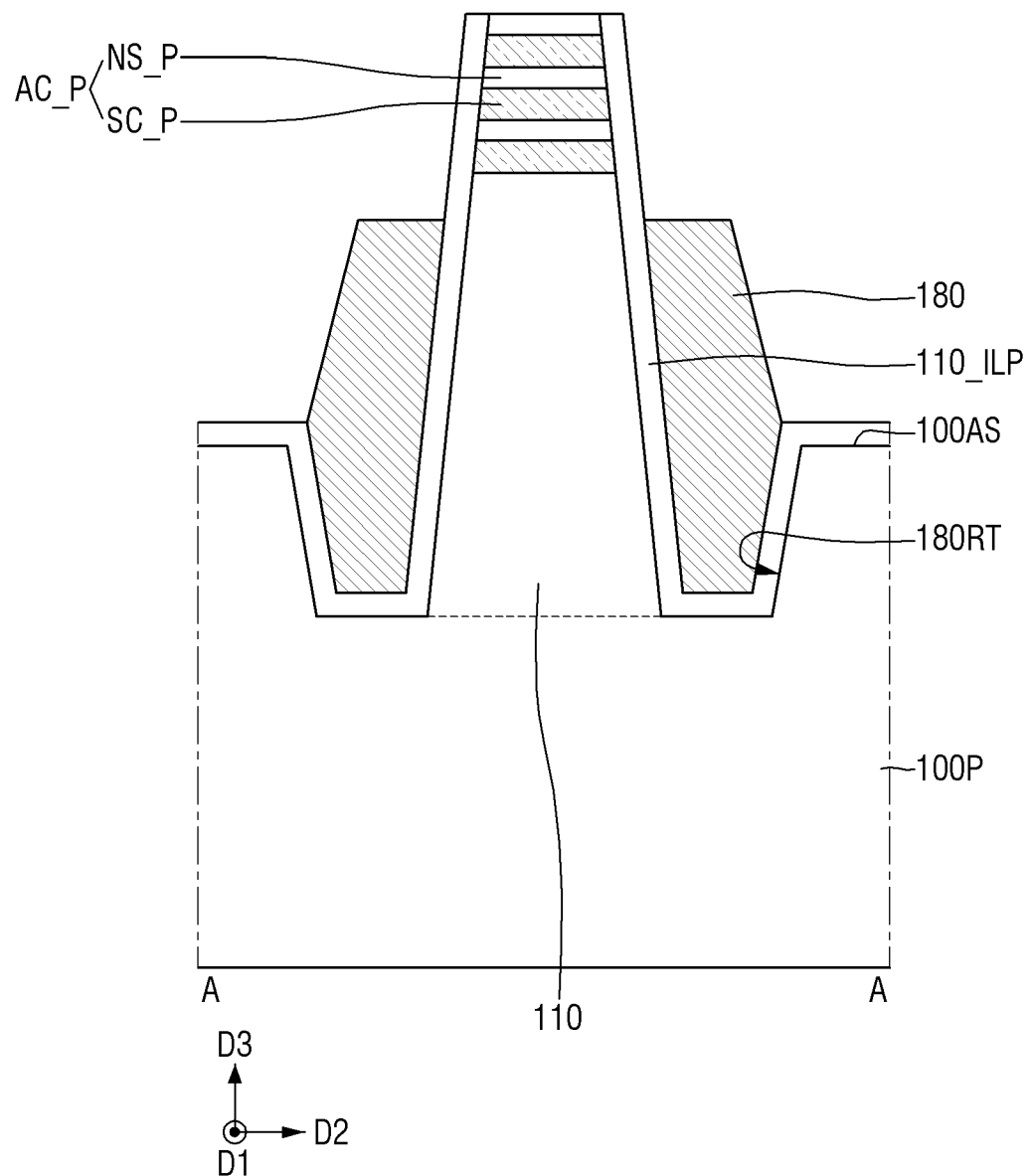

Referring to FIG. 20, the rail conductive film 180_MP may be patterned to form a pair of first power rails 180 on both sides of the first fin type pattern 110. The upper surface of the first power rail 180 may be lower than the upper surface of the first fin type pattern 110.

Figure 21:
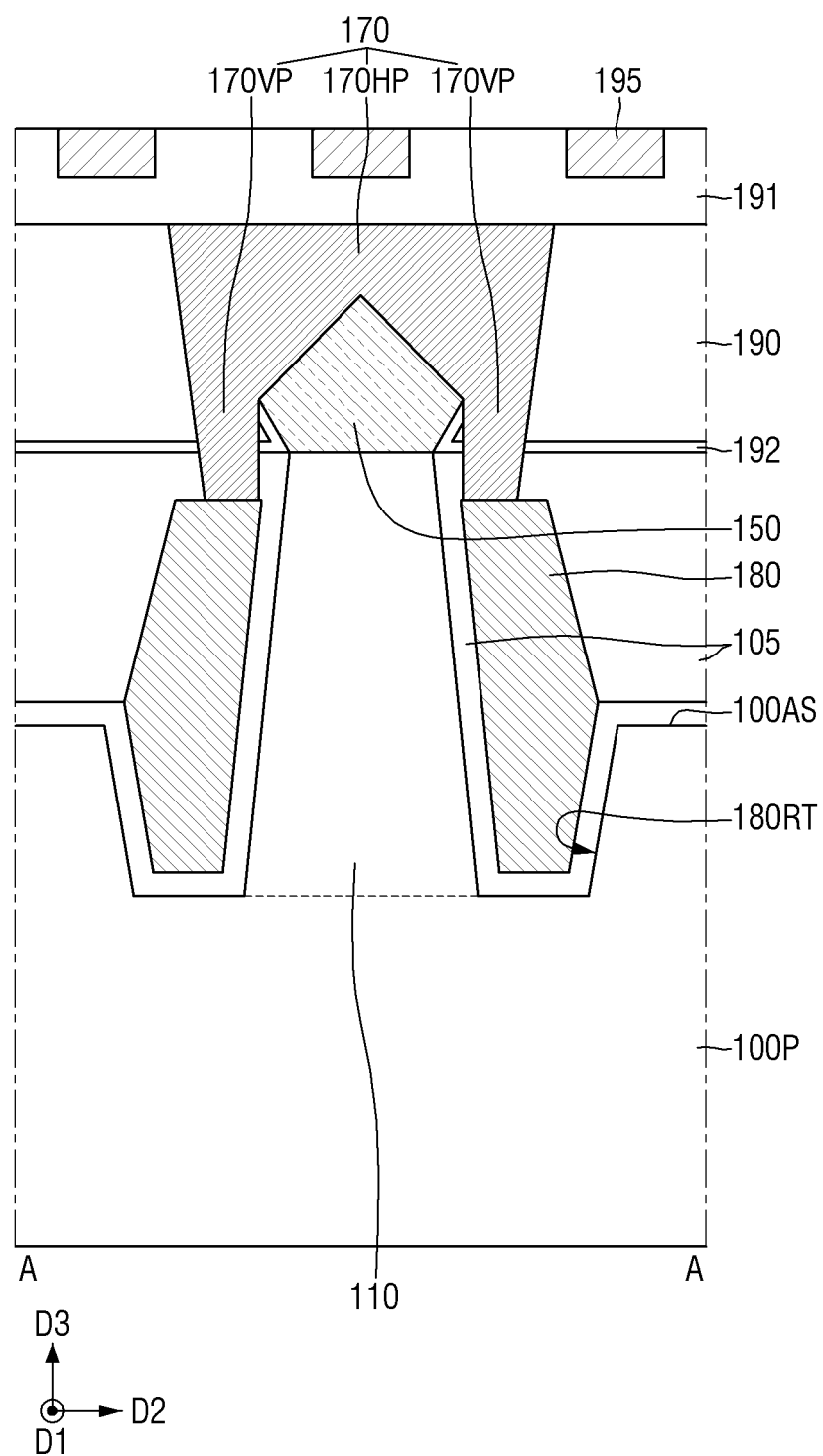

Referring to FIG. 21, the field insulating film 105 may be formed on the first surface 100AS of the pre substrate 100P. The field insulating film 105 includes the rest of the fin liner 110_ILP of FIGS. 19 and 20. After the field insulating film 105 is formed, the source/drain pattern 150 may be formed on the upper surface of the first fin type pattern 110. Subsequently, an etching stop film 192 and a first interlayer insulating film 190 may be formed. Further, a source/drain pattern 150 and a first power supply source/drain contact 170 connected to the first power rail 180 are formed inside the etching stop film 192 and the first interlayer insulating film 190. Subsequently, a second interlayer insulating film 191 and a wiring line 195 are formed.

Figure 22:
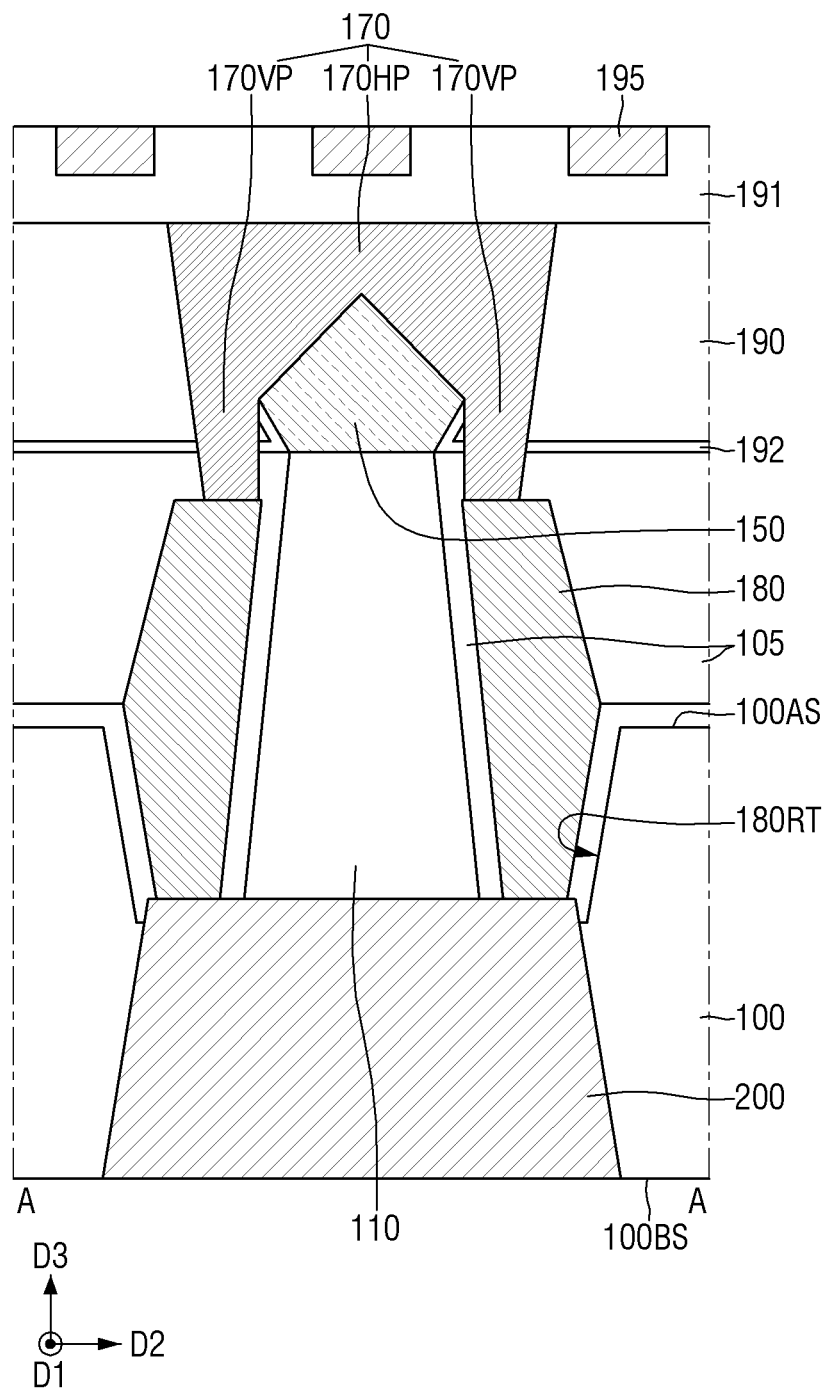
Figure 23:
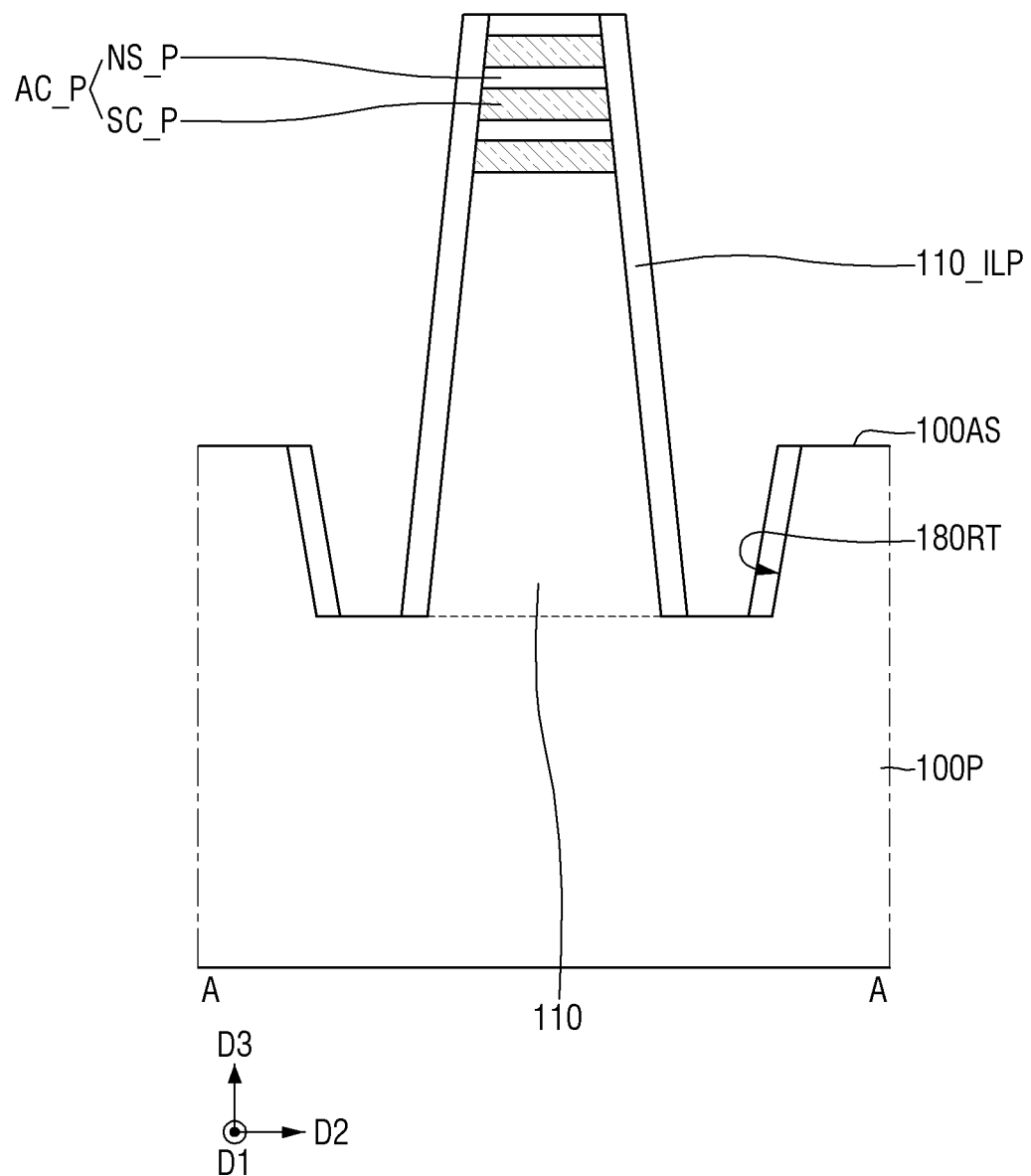
FIG. 23 illustrates a process step associated with the methods of FIGS. 17-22, which may be performed after the steps illustrated by FIG. 17.

Referring to FIG. 22, a part of the pre substrate 100P may be removed to form the substrate 100. The second surface 100BS of the substrate is defined accordingly. Subsequently, a through via 200 penetrating the substrate 100 is formed. FIGS. 23 to 27 are intermediate stage diagrams for explaining the method for fabricating the semiconductor device according to some embodiments. FIG. 23 may be a step performed after FIG. 17. Further, FIGS. 23 to 26 may be cross-sectional views taken along A-A of FIG. 1 or 14. FIG. 27 may be a cross-sectional view taken along B-B of FIG. 1.

Referring to FIG. 23, a fin liner 110_ILP may be formed on the side walls of the first fin type pattern 110 and the active pattern AC_P. The fin liner 110_ILP may be formed on the side walls of the rail trench 180RT. Unlike that shown, the fin liner 110_ILP may not be formed on the side walls of the rail trench 180RT. The fin mask F_MASK on the upper surface of the active pattern AC_P is then removed.

Figure 24:
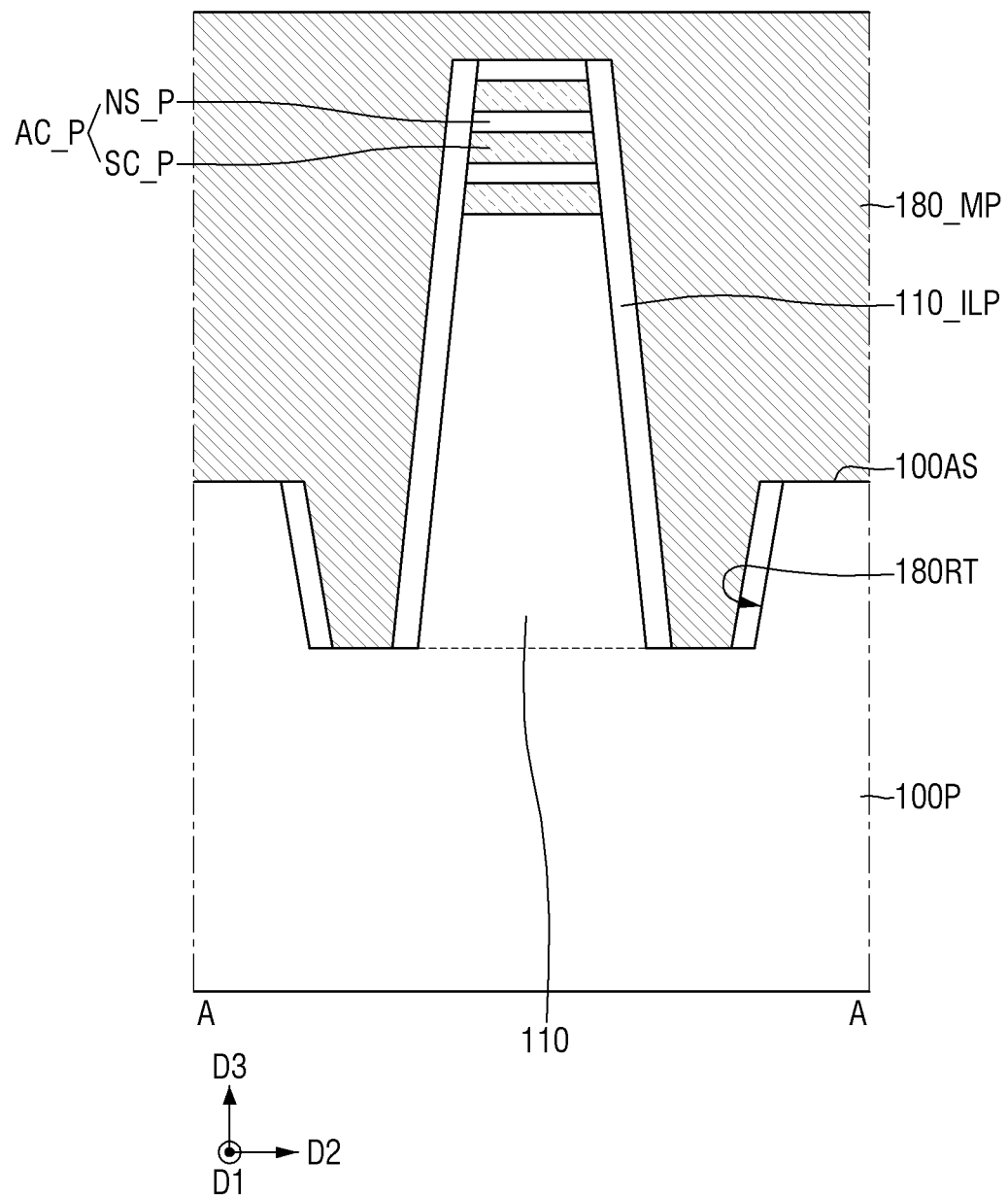
FIGS. 24-26 are alternative cross-sectional views taken along line A-A of FIG. 1 or line A-A of FIG. 14, according to embodiments of the invention.

Referring to FIG. 24, a rail conductive film 180_MP that fills the rail trench 180RT may be formed on the fin liner 110_ILP. The rail conductive film 180_MP is also formed on the first surface 100AS of the pre substrate 100P. The rail conductive film 180_MP covers the upper surface of the active pattern AC_P.

Figure 25:
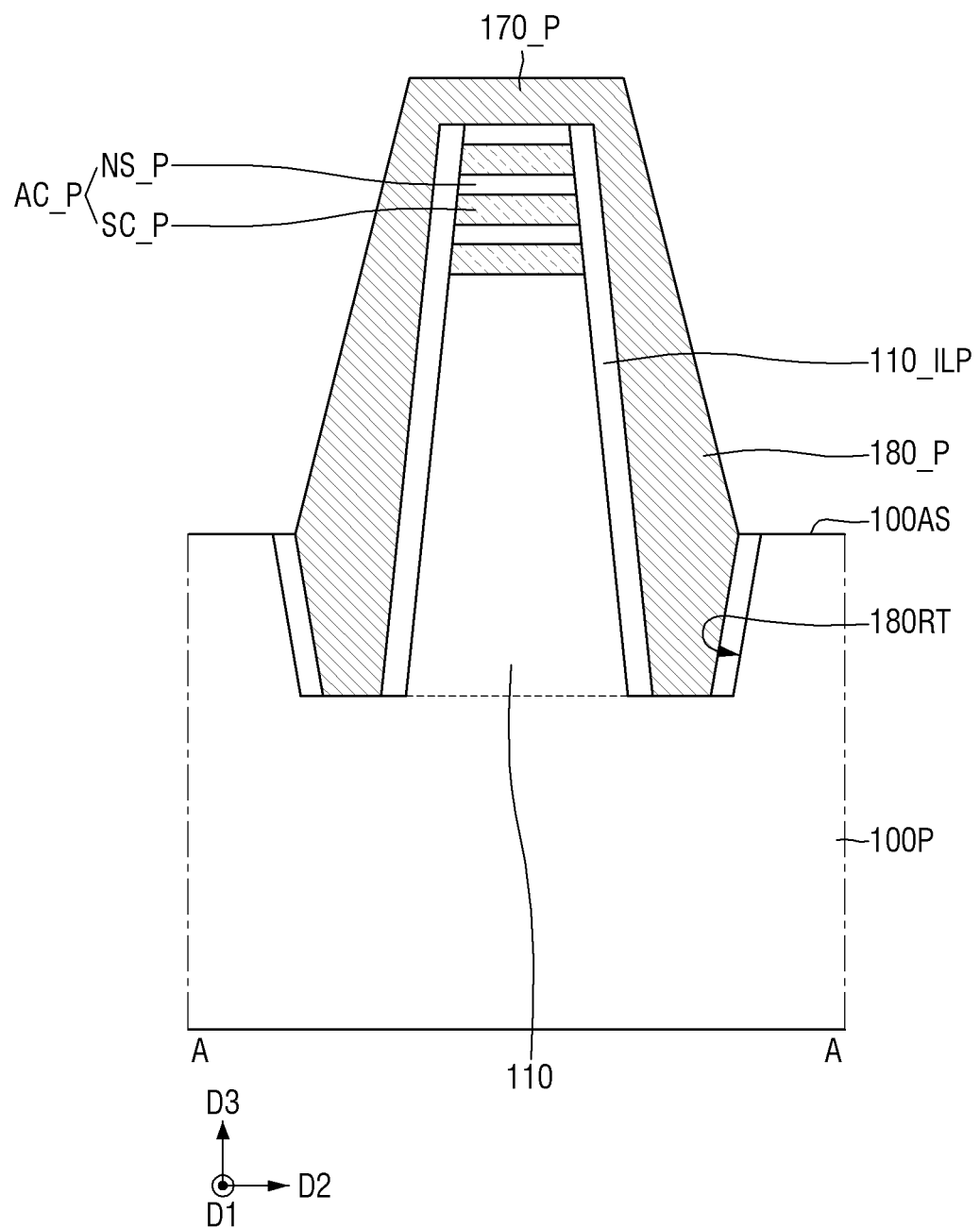

Referring to FIG. 25, the rail conductive film 180_MP is patterned to form a pre power supply source/drain contact 170_P and a pre power rail 180_P. The cross-sectional view taken along B-B of FIG. 1 may be the same as that of FIG. 25.

Figure 26:
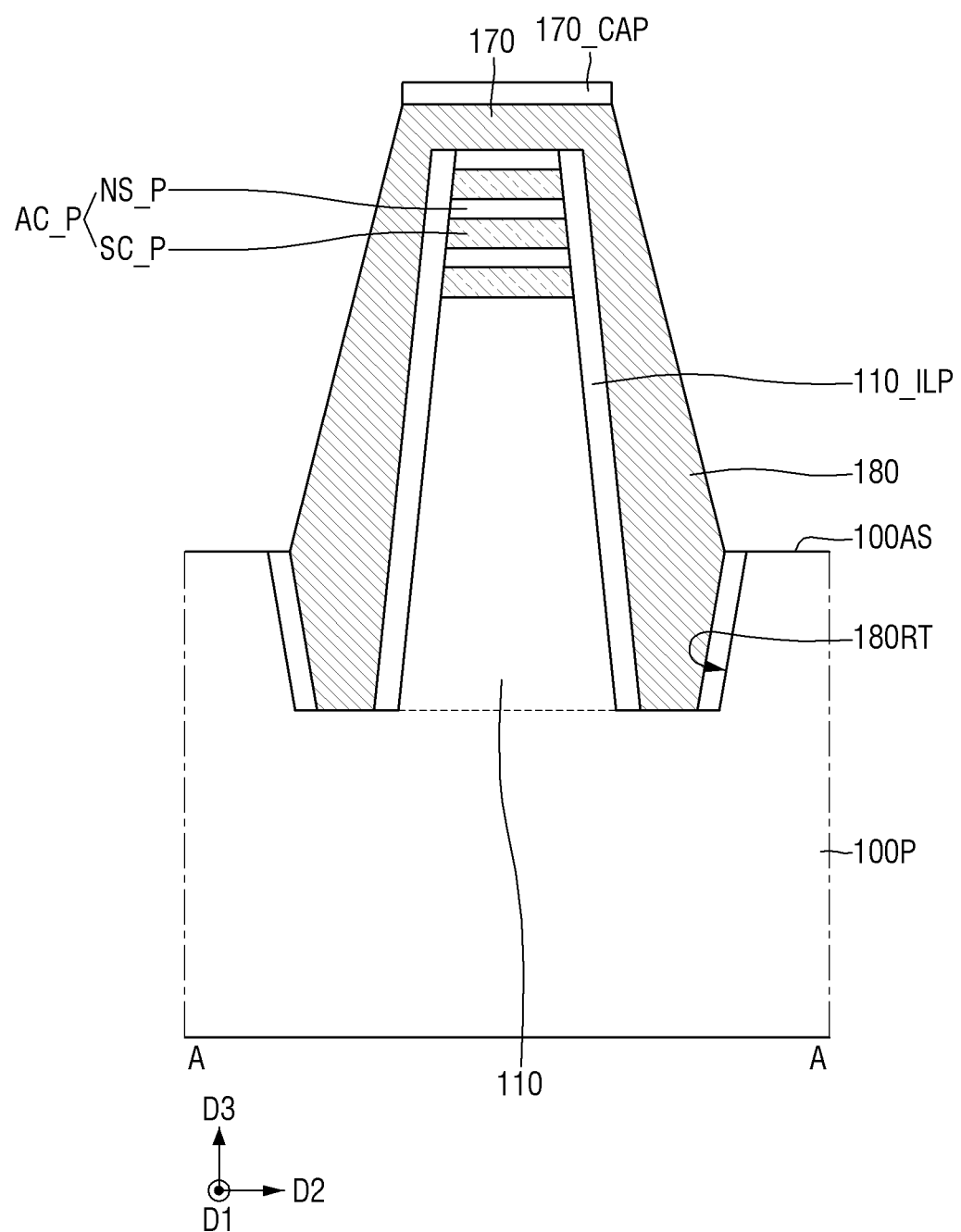
Figure 27:
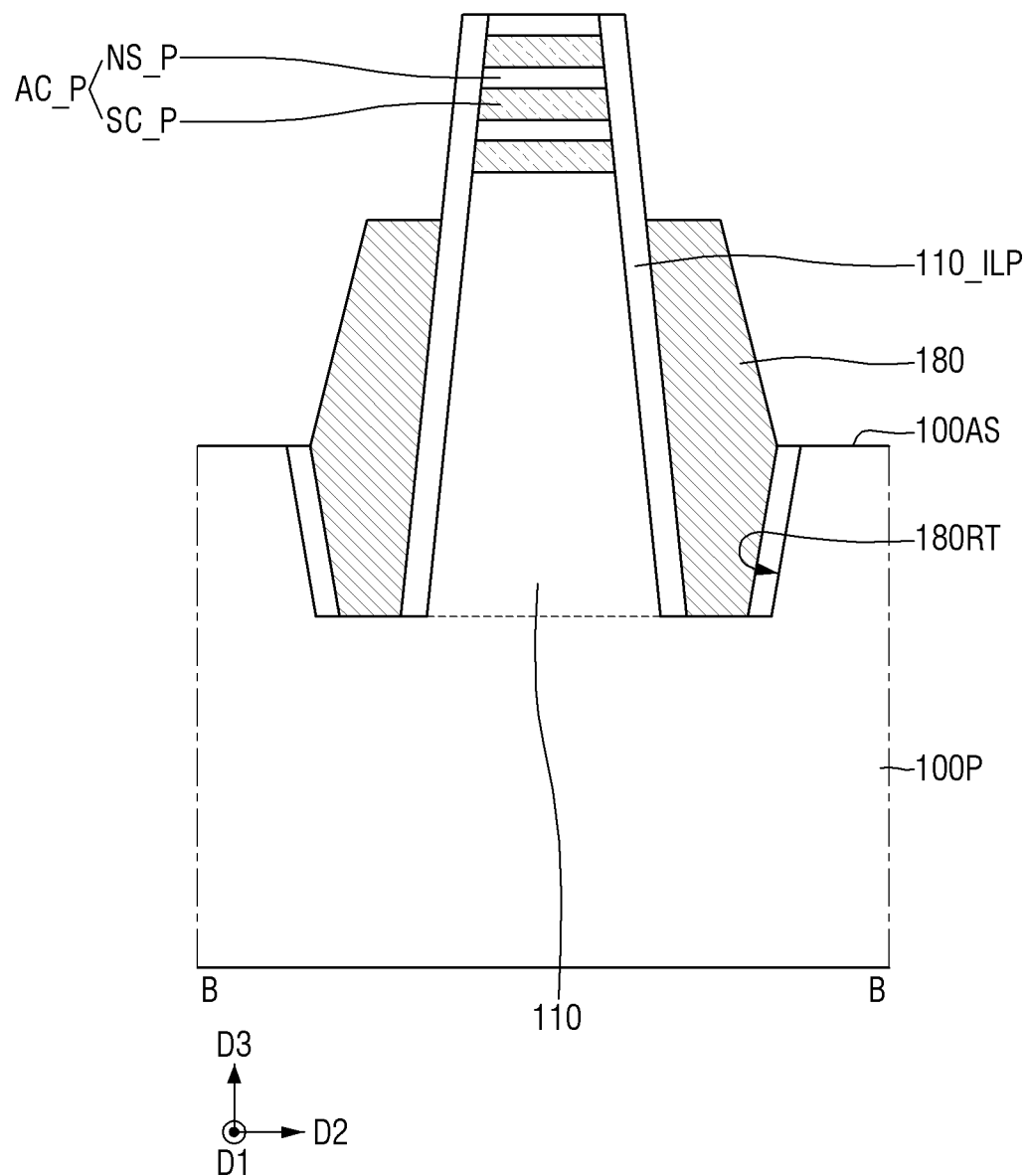
FIG. 27 is an alternative cross-sectional view of a semiconductor device taken along line B-B of FIG. 1, according to embodiments of the invention.

Referring to FIGS. 26 and 27, a contact capping film 170_CAP may be formed on the pre power supply source/drain contact 170_P. The contact capping film 170_CAP may be formed at the position where the first power supply source/drain contact 170 is formed in FIGS. 1 and 14. Some of the pre power supply source/drain contact 170_P and the pre power rail 180_P are etched, using the contact capping film 170_CAP as a mask. The first power rail 180 and the first power supply source/drain contact 170 having an integral structure are formed accordingly.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device comprising:
    a substrate which includes a first surface and a second surface opposite to the first surface in a first direction;
    a fin type pattern which protrudes upward from the first surface of the substrate and extends in a second direction perpendicular to the first direction;
    a pair of power rails which are placed on both sides of the fin type pattern and extend in the second direction;
    a source/drain pattern that extends on and forms an electrically conductive junction with an upper surface of the fin type pattern; and
    a power source/drain contact which is placed on the first surface of the substrate and electrically connects the pair of power rails together and to the source/drain pattern.

2. The semiconductor device of claim 1, further comprising:
    a through via which penetrates the substrate and is connected to the pair of power rails,
    wherein the through via extends from the second surface of the substrate to the power rail.

3. The semiconductor device of claim 1, wherein each power rail includes a first side wall facing a side wall of the fin type pattern, and a second side wall opposite to the first side wall,
    the power rail includes a first portion and a second portion, and
    a sign of an inclination of the second side wall in the first portion of the power rail is opposite to a sign of an inclination of the second side wall in the second portion of the power rail.

4. The semiconductor device of claim 3, wherein the second portion of the power rail protrudes upward from the first surface of the substrate, and
    a width of the first portion of the power rail increases as it goes away from the second surface of the substrate.

5. The semiconductor device of claim 1, further comprising:
    a rail trench which is retracted from the first surface of the substrate toward the second surface of the substrate,
    wherein the fin type pattern protrudes from a bottom surface of the rail trench.

6. The semiconductor device of claim 1, further comprising:
a pair of rail trenches which are retracted from the first surface of the substrate toward the second surface of the substrate,
wherein the fin type pattern protrudes from the first surface of the substrate between the rail trenches.

7. The semiconductor device of claim 1, further comprising:
a field insulating film which covers at least a part of a side wall of the fin type pattern, on the first surface of the substrate,
wherein the field insulating film covers an upper surface of the power rail.

8. The semiconductor device of claim 7, wherein the power source/drain contact includes a pair of vertical parts which extend in the first direction and are in contact with the power rail, and a horizontal part which is directly connected to the pair of vertical parts and extends in a third direction perpendicular to the first direction and the second direction.

9. The semiconductor device of claim 1, wherein the power rail and the power source/drain contact have an integral structure, and
no boundary surface exists between the power rail and the power source/drain contact.

10. The semiconductor device of claim 8, wherein the horizontal part of the power source/drain contact electrically contacts at least one surface of the source/drain pattern.

11. The semiconductor device of claim 1, further comprising:
a gate electrode which is placed on the fin type pattern and extends in a third direction perpendicular to the first direction and the second direction,
wherein the source/drain pattern is placed between the gate electrode and the power source/drain contact.

12. The semiconductor device of claim 1, further comprising:
a field insulating film placed on the first surface of the substrate, and a gate electrode placed on the field insulating film and intersecting the fin type pattern,
wherein the gate electrode covers the fin type pattern protruding upward from an upper surface of the field insulating film.

13. The semiconductor device of claim 1, further comprising:
a sheet pattern spaced apart from an upper surface of the fin type pattern in the first direction, and a gate electrode which intersects the fin type pattern and surrounds the sheet pattern.

14. A semiconductor device comprising:
a pair of power rails which extend long in a first direction and are spaced apart in a second direction different from the first direction, on a substrate;
a fin type pattern placed between the pair of power rails and extending in the first direction;
a source/drain pattern that extends on and forms an electrically conductive junction with an upper surface of the fin type pattern; and
a power source/drain contact which extends in the second direction on the fin type pattern, and electrically connects the source/drain pattern and the pair of power rails together.

15. The semiconductor device of claim 14, wherein the power source/drain contact overlaps the source/drain pattern in a third direction perpendicular to the first direction and the second direction.

16. The semiconductor device of claim 14, wherein the source/drain pattern and the power source/drain contact are adjacent to each other in the first direction.

17. The semiconductor device of claim 14, further comprising:
a through via which penetrates the substrate and connected to the pair of power rails,
wherein the through via extends in a third direction different from the first direction and the second direction.

18. A semiconductor device comprising:
a substrate including a first surface and a second surface opposite to the first surface in a first direction;
a rail trench which is retracted from the first surface of the substrate toward the second surface of the substrate;
a fin type pattern which protrudes from a bottom surface of the rail trench, and includes an upper surface protruding upward from the first surface of the substrate;
a pair of power rails which are placed on both sides of the fin type pattern and extend in a second direction perpendicular to the first direction;
a power source/drain contact that extends on the first surface of the substrate and connects the pair of power rails;
a source/drain pattern that forms an electrically conductive junction with the upper surface of the fin type pattern and is electrically connected to the power source/drain contact; and
a through via which extends from the second surface of the substrate in the first direction and is connected to the pair of power rails,
wherein a part of each of the power rails is placed inside the rail trench.

19. The semiconductor device of claim 18, wherein the power rail includes a boundary surface which is in contact with the power source/drain contact.

20. The semiconductor device of claim 18, wherein the power source/drain contact includes a pair of vertical parts which extends in the first direction and is in contact with the power rail, and a horizontal part which is directly connected to the pair of vertical parts and extends in a third direction perpendicular to the first direction and the second direction.

* * * * *